(12) United States Patent
Maruyama et al.

(10) Patent No.: US 9,020,685 B2
(45) Date of Patent: Apr. 28, 2015

(54) METHOD OF MEASURING CONTACT FAILURE AND CONTACT FAILURE MEASURING DEVICE

(75) Inventors: Susumu Maruyama, Tsurugashima (JP); Hideyuki Tsuchikiri, Asaka (JP); Koji Fukuda, Hanno (JP); Atsushi Demachi, Koganei (JP)

(73) Assignee: Honda Motor Co., Ltd., Tokyo (JP)

( * ) Notice: Subject to any disclaimer, the term of this patent is extended or adjusted under 35 U.S.C. 154(b) by 413 days.

(21) Appl. No.: 13/580,251

(22) PCT Filed: Feb. 22, 2011

(86) PCT No.: PCT/JP2011/053825
§ 371 (c)(1),
(2), (4) Date: Aug. 21, 2012

(87) PCT Pub. No.: WO2011/105363
PCT Pub. Date: Sep. 1, 2011

(65) Prior Publication Data
US 2012/0319854 A1 Dec. 20, 2012

(30) Foreign Application Priority Data

Feb. 23, 2010 (JP) .................................. 2010-036849
Feb. 3, 2011 (JP) .................................. 2011-021982

(51) Int. Cl.
*G01M 17/00* (2006.01)
*G06F 7/00* (2006.01)
*G01R 33/02* (2006.01)
(Continued)

(52) U.S. Cl.
CPC ................ *G01R 33/02* (2013.01); *G01R 31/04* (2013.01); *G01R 33/0385* (2013.01); *G01R 31/006* (2013.01)

(58) Field of Classification Search
CPC .. G01R 31/021; G01R 31/026; G01R 31/006; G01R 33/02; G01R 33/0385
USPC .......................................... 340/635; 324/529
See application file for complete search history.

(56) References Cited

U.S. PATENT DOCUMENTS 4,951,385 A * 8/1990 DeSanto .......................... 29/754
5,107,428 A * 4/1992 Bethencourt et al. ........ 701/29.2
(Continued)

FOREIGN PATENT DOCUMENTS

CN 2466012 Y 12/2001
JP 03-081571 U 8/1991
(Continued)

OTHER PUBLICATIONS

International Search Report and Written Opinion dated Apr. 19, 2011 corresponding to International Patent Application No. PCT/JP2011/053825.
(Continued)

*Primary Examiner* — Eric M Blount
(74) *Attorney, Agent, or Firm* — Squire Patton Boggs (US) LLP

(57) ABSTRACT

In the disclosed method of measuring contact failure and contact failure measuring device, the magnitude of the excessive response fluctuation of the inductive magnetic field around a harness under measurement when an external force is applied to a terminal fitting part of the harness is detected by a magnetic sensor, and the result is displayed as an index of the quality of the contact state of the terminal fitting part.

21 Claims, 24 Drawing Sheets

(51) Int. Cl.
*G01R 31/04* (2006.01)
*G01R 33/038* (2006.01)
*G01R 31/00* (2006.01)

(56) References Cited

U.S. PATENT DOCUMENTS

| | | | |
|---|---|---|---|
| 5,491,631 A * | 2/1996 | Shirane et al. | 701/29.6 |
| 6,498,995 B2 * | 12/2002 | Kawase et al. | 702/58 |
| 8,164,433 B2 * | 4/2012 | Sivertsen | 340/438 |
| 2003/0141878 A1 * | 7/2003 | Shinzou et al. | 324/539 |
| 2007/0184686 A1 * | 8/2007 | Hayashi et al. | 439/76.2 |

FOREIGN PATENT DOCUMENTS

| | | |
|---|---|---|
| JP | 3-242568 A | 10/1991 |
| JP | 08-043563 A | 2/1996 |
| JP | 09-026454 A | 1/1997 |
| JP | 2000-002737 A | 1/2000 |
| JP | 2000-261923 A | 9/2000 |
| JP | 2001-033356 A | 2/2001 |
| JP | 2001-242206 A | 9/2001 |
| JP | 2004-170091 A | 6/2004 |
| JP | 2004-219365 A | 8/2004 |
| JP | 2006-064551 A | 3/2006 |
| JP | 2009-133822 A | 6/2009 |
| JP | 2011-054522 A | 3/2011 |

OTHER PUBLICATIONS

Japanese Office Action dated Jun. 3, 2014, for corresponding Japanese Patent Application No. 2012-501782.

Keming Zhang, "Inspection and Repair for Failure of Harness of Vehicle Circuit", Heavy Truck, No. 4, Aug. 31, 2000, pp. 40-42.

Chinese Office Action application No. 201180010504.6 dated Feb. 19, 2014.

* cited by examiner

DTC P0102: Air flow meter voltage is low.

NOTE: Prior to fault diagnosis, record all frozen
    data and on-board snapshot data, and confirm
    general information about fault diagnosis.

REPRODUCTION TEST:
 -1. Turn on (II) ignition switch
 -2. Confirm air flow meter in data list with tester.

Equal to or lower than about 0.1 V ?
  YES: Go to step 2
  No: Temporary contact fault in coupler between
     ECU and air flow meter

METHOD OF MEASURING CONTACT FAILURE AND CONTACT FAILURE MEASURING DEVICE

TECHNICAL FIELD

The present invention relates to a contact fault measuring method (method of measuring contact failure) of and a contact fault measuring apparatus (contact failure measuring device) for measuring whether or not there is a contact fault in a terminal fitting portion of a harness in a wiring system.

BACKGROUND ART

There has heretofore been known a diagnosing apparatus for identifying the location of a fault in an electronic control system on a vehicle by reading a fault code that is recorded in an electronic control unit (ECU) incorporated in the vehicle. See, U.S. Pat. No. 5,491,631 (hereinafter referred to as "U.S. Pat. No. 5,491,631A"). According to U.S. Pat. No. 5,491,631A, in the event of a fault of a peripheral device connected to the ECU (1) of the vehicle, a self-diagnostic means (52) generates fault information and stores the generated fault information in a fault code storage means (53) (see, for example, column 13, lines 31-35). When the fault of a sensor (4A) as the peripheral device is detected, the self-diagnostic means (52) identifies the location of the fault (systematic fault details, etc.) by displaying an inspection procedure on a fault diagnosing apparatus (2), based on the fault information and the fault code, which serves to identify the fault information (see, for example, column 18, line 32, through column 22, line 38, and FIGS. 21 through 24).

SUMMARY OF INVENTION

A fault diagnosing method, which is carried out by the fault diagnosing apparatus disclosed in U.S. Pat. No. 5,491,631A, is useful as it can identify a system abnormality (i.e., an electric circuit suffering an abnormality) relatively easily. However, for actually repairing the system abnormality, it is necessary to identify not only the system abnormality, but also to identify a specific faulty component and a defective location, and to replace the component. It often is difficult or is highly tedious and time-consuming to identify the location to be repaired.

More specifically, locations to be repaired may include the ECU itself, sensors, an actuator, a wiring, couplers, etc. If a harness coupler (terminal fitting portion) suffers a contact failure thereby causing an electronic control system fault, then according to a simple component replacing process, the fault may be removed temporarily when the harness coupler is detached and attached again in the component replacing process. The operator may make a wrong diagnosis and replace the harness coupler with a new one, without realizing that the fault is due to a harness coupler contact failure, and the operator is unable to leave proof of the fault, which indicates the location of the failure.

When a wrong diagnosis is made or if the electronic control system is repaired as described above, even though the contact failure may be removed by detaching and attaching the harness coupler again, the same electronic control system fault tends to occur again, since the repair was not essential. If the electronic control system suffers the same fault again, then the customer is likely to lose confidence in the electronic control system. In addition, the normal harness coupler may possibly be unfairly treated as a defective component, and thus the manufacturer will be unable to carry out accurate quality analysis on the harness coupler.

It is highly difficult to diagnose contact failures that tend to take place temporarily due to vibrations caused while the vehicle is in motion. It is necessary to perform a fault diagnosis while the vehicle undergoes a test run until and the fault occurs again.

The present invention has been made in view of the above difficulties. It is an object of the present invention to provide a contact fault measuring method of and a contact fault measuring apparatus for measuring whether or not there is a contact fault in a terminal fitting portion of a harness while the harness remains connected in the same manner as when the abnormality occurred.

According to the present invention, there is provided a contact fault measuring method of measuring whether or not there is a contact fault in a terminal fitting portion of a harness in a wiring system, comprising placing a magnetic sensor in proximity to the harness to be measured, and applying external forces to the terminal fitting portion of the harness to be measured, detecting, with the magnetic sensor, a magnitude of a transient response variation in an induced magnetic field around the harness when the external forces are applied, and displaying the detected magnitude as an indicator of whether or not a contact state of the terminal fitting portion is acceptable.

According to the present invention, it is possible to determine whether or not there is a contact fault in the terminal fitting portion of the harness while the harness remains connected in the same manner as when an abnormality occurs. More specifically, while a contact fault is temporarily not occurring, even though the terminal fitting portion is connected unstably, current may continue to flow through the terminal fitting portion before external forces are applied thereto. However, when external forces are applied to the terminal fitting portion, a contact fault may be reproduced in the unstably connected region thereof, which instantaneously prevents current from flowing, and when the terminal fitting portion is connected again, a transient response variation in the induced magnetic field around the harness including the terminal fitting portion may increase temporarily. This also happens when the terminal fitting portion is electrically charged. According to the present invention, the magnitude of the transient response variation in the induced magnetic field around the harness when the external forces are applied is detected and displayed as an indicator of whether or not a contact state of the terminal fitting portion is acceptable. Consequently, it is possible to determine whether or not there is a contact fault in the terminal fitting portion based on the displayed indicator, without requiring the terminal fitting portion to be separated, i.e., while the harness remains connected in the same manner as when an abnormality occurs.

The phenomenon in which the transient response variation in the induced magnetic field becomes temporarily larger can be detected within a region around the harness, which is spaced slightly from the terminal fitting portion. Therefore, even in a space such as the engine compartment of a vehicle, for example, which is crammed full of wires and other components, the user can choose a measurement location where the magnetic sensor can be installed with ease. Consequently, the measuring process can be performed easily.

The method may further comprise judging whether or not the magnitude of the transient response variation in the induced magnetic field around the harness when the external forces are applied exceeds a threshold value for determining the occurrence of a contact fault, and displaying the judgment result as the indicator of whether or not the contact state is acceptable.

The threshold value for the magnitude of the transient response variation in the induced magnetic field, which is used to determine a contact fault, is represented by the value of a transient response variation in the induced magnetic field, which is too large to be generated by a range of noise produced if a current continues to flow in the terminal fitting portion. Therefore, even if there is something that generates a steady noise or magnetic field around the terminal fitting portion, it is possible to judge whether or not there is a contact fault essentially without being adversely affected by the steady noise or magnetic field. Therefore, the measurement process can be carried out even in a space such as the engine compartment of a vehicle, which is crammed full of wires and other components.

The magnetic sensor may continuously detect the magnitude of the transient response variation in the induced magnetic field around the harness, and judge whether or not the detected magnitude exceeds the threshold value, and when the detected magnitude exceeds the threshold value, the judgment result is displayed on a display unit as the indicator of whether or not the contact state is acceptable. If the magnitude of the transient response variation in the induced magnetic field around the harness when the external forces are applied exceeds the threshold value, the fact that the magnitude of the transient response variation exceeds the threshold value is displayed on the display unit. Thus, the user can easily confirm the occurrence of a contact fault based on the displayed data.

The method may further comprise storing the magnitude of the transient response variation in the induced magnetic field, which is continuously detected by the magnetic sensor, in a temporary storage unit, and when the magnitude of the transient response variation in the induced magnetic field is judged to exceed the threshold value, saving the magnitudes of transient response variations in the induced magnetic field, which are stored in the temporary storage unit before and after the magnitude of the transient response variation in the induced magnetic field is judged, in a saving unit. Accordingly, it is possible to effectively store the data of the transient response variations in the induced magnetic field before and after the contact fault occurs, without the need for the saving unit to have an excessively large storage capacity.

The magnetic sensor may secure the harness in a gripped state. Accordingly, it is possible to detect a transient response variation in the induced magnetic field while the detecting element of the magnetic sensor and the harness are secured in a relative positional relationship. Accordingly, the magnetic sensor can stably detect a transient response variation in the induced magnetic field even when external forces are applied to the terminal fitting portion.

The method may further comprise detecting the timing of the external forces applied to the terminal fitting portion of the harness to be measured, with an external force detecting sensor, and displaying the state of occurrence of a contact fault on a display unit, using the magnitude of the transient response variation in the induced magnetic field around the harness when the external forces are applied. The display unit displays the state of occurrence of the contact fault using the magnitude of the transient response variation in the induced magnetic field around the harness when the external forces are applied to the terminal fitting portion. It is thus possible to eliminate the effects of disturbance noise, magnetic field noise due to electromagnetic waves, etc.

The magnetic sensor may continuously detect the magnitude of the transient response variation in the induced magnetic field around the harness, and the method may further comprise judging, with a judgment section, whether or not the magnitude of the transient response variation when the external forces are applied to the terminal fitting portion exceeds a threshold value for determining the occurrence of a contact fault, and displaying on the display unit the judgment result as the indicator of whether or not the contact state is acceptable. Accordingly, it is possible to reliably detect the magnitude of the transient response variation in the induced magnetic field at the timing at which the external forces are applied to the terminal fitting portion.

A vibrating tool for applying the external forces to the terminal fitting portion of the harness may be provided, and the external force detecting sensor may be mounted on the vibrating tool. With the external force detecting sensor being mounted on the vibrating tool, it is possible to detect the timing of the external forces applied to the terminal fitting portion irrespective of the displacement of the harness. Accordingly, the measurement process is simplified.

The external force detecting sensor may comprise an acceleration sensor. The acceleration sensor, which is used as the external force detecting sensor, makes it easy to detect vibrations the instant that the external forces are applied. Therefore, whether or not external forces are applied can be detected effectively.

According to the present invention, there is also provided a contact fault measuring apparatus for measuring whether or not there is a contact fault in a terminal fitting portion of a harness in a wiring system, comprising a magnetic sensor detachably fixed in a position proximal to the harness to be measured, a display unit for displaying the magnitude of a transient response variation in an induced magnetic field around the harness, which is represented by an output signal from the magnetic sensor when external forces are applied to the terminal fitting portion of the harness to be measured, as an indicator of whether or not a contact state of the terminal fitting portion of the harness to be measured is acceptable.

According to the present invention, it is possible to determine whether or not there is a contact fault in the terminal fitting portion of the harness while the harness remains connected, in the same manner as when an abnormality occurs. More specifically, while a contact fault temporarily does not occur even though the terminal fitting portion is connected unstably, current may continue to flow through the terminal fitting portion before external forces are applied thereto. However, when external forces are applied to the terminal fitting portion, the contact fault may be reproduced in an unstably connected region thereof, which instantaneously prevents current from flowing. Also, when the terminal fitting portion is connected again, a transient response variation in the induced magnetic field around the harness including the terminal fitting portion may increase temporarily. According to the present invention, the magnitude of the transient response variation in the induced magnetic field around the harness when external forces are applied is detected and displayed as an indicator of whether or not a contact state of the terminal fitting portion is acceptable. Consequently, it is possible to determine whether or not there is a contact fault in the terminal fitting portion based on the displayed indicator, without requiring the terminal fitting portion to be separated, i.e., while the harness remains connected in the same state as when an abnormality occurs.

The phenomenon in which the transient response variation in the induced magnetic field becomes temporarily larger can be detected in a region around the harness, which is spaced slightly from the terminal fitting portion. Therefore, even in a space such as the engine compartment of a vehicle, for example, which is crammed full of wires and components, the user can choose a measurement location where the magnetic sensor can be installed with ease. Consequently, the measuring process can be performed easily.

In addition, it is possible to detect a transient response variation in the induced magnetic field while the detecting element of the magnetic sensor and the harness are secured in a relative positional relationship. Accordingly, the magnetic sensor can stably detect a transient response variation in the induced magnetic field even when external forces are applied to the terminal fitting portion.

The apparatus may further comprise a judgment section for judging whether or not the magnitude of the transient response variation in the induced magnetic field around the harness, which is represented by an output signal from the magnetic sensor, exceeds a threshold value for determining the occurrence of a contact fault in the terminal fitting portion, wherein when the magnitude of the transient response variation in the induced magnetic field exceeds the threshold value, the display unit displays an indication that the magnitude of the transient response variation in the induced magnetic field has exceeded the threshold value.

The threshold value for the magnitude of the transient response variation in the induced magnetic field, which is used to judge a contact fault, is represented by the value of a transient response variation in the induced magnetic field, which is too large to be generated by a range of noise produced while current continues to flow in the terminal fitting portion. Therefore, even if something is performed for generating a steady noise or magnetic field around the terminal fitting portion, it is possible to judge whether or not there is a contact fault essentially without being adversely affected by noise or magnetic fields. Therefore, the measurement process can be carried out even in a space such as the engine compartment of a vehicle, which is crammed full of wires and other components.

When the magnitude of the transient response variation in the induced magnetic field exceeds the threshold value, the display unit displays an indication that the magnitude of the transient response variation in the induced magnetic field has exceeded the threshold value. Therefore, based on the displayed data, the user can easily confirm the occurrence of a contact fault.

The apparatus may further comprise a frequency filter for removing components of the output signal from the magnetic sensor, other than a component in a frequency band that can be generated upon the occurrence of the contact fault, and a peak hold circuit for holding a peak value of a value represented by an output signal from the frequency filter, wherein when the peak value exceeds the threshold value, the display unit displays an indication that the peak value has exceeded the threshold value.

With the above arrangement, the components of the output signal from the magnetic sensor, other than the component in the frequency band that can be generated upon the occurrence of the contact fault, are removed. Consequently, it is possible to avoid an erroneous decision due to causes other than a contact fault, and also to reliably display the occurrence of a contact fault in the terminal fitting portion and to store data concerning the contact fault, even in a location that is crammed full of wires or in an environment having a large amount of magnetic noise.

The apparatus may further comprise a temporary storage unit for continuously and temporarily storing the output signal from the magnetic sensor, and a saving unit for saving the output signal from the magnetic sensor, wherein the magnitude of the transient response variation in the induced magnetic field, which is continuously detected by the magnetic sensor, is stored in the temporary storage unit, and when the peak value exceeds the threshold value, the magnitudes of transient response variations in the induced magnetic field, which are stored in the temporary storage unit before and after the peak value exceeds the threshold value, are saved in the saving unit.

Thus, it is possible to effectively store the data of the transient response variations in the induced magnetic field before and after the contact fault occurs, without the need for the saving unit, such as a nonvolatile memory or the like, to have an excessively large storage capacity.

According to the present invention, there is also provided a contact fault measuring apparatus for measuring whether or not there is a contact fault in a terminal fitting portion of a harness in a wiring system, comprising a magnetic sensor for detecting the magnitude of a transient response variation in an induced magnetic field around the harness to be measured, an external force detecting sensor for detecting the timing of external forces applied to the terminal fitting portion of the harness to be measured, and a display unit for displaying the timing of the applied external forces, which is detected by the external force detecting sensor, and the magnitude, which is represented by an output signal from the magnetic sensor, of the transient response variation in the induced magnetic field around the harness.

According to the present invention, there is also provided a contact fault measuring apparatus for measuring whether or not there is a contact fault in a terminal fitting portion of a harness in a wiring system, comprising a magnetic sensor for detecting the magnitude of a transient response variation in an induced magnetic field around the harness to be measured, an external force detecting sensor for detecting the timing of external forces applied to the terminal fitting portion of the harness to be measured, a judgment section for judging whether or not the magnitude of the transient response variation in the induced magnetic field around the harness, which is represented by an output signal from the magnetic sensor, exceeds a threshold value for determining the occurrence of a contact fault in the terminal fitting portion, and a display unit for displaying a judgment result from the judgment section based on the timing of applied external forces detected by the external force detecting sensor.

According to the present invention, there is further provided a contact fault measuring method of measuring whether or not there is a contact fault in a terminal fitting portion of a harness in a wiring system, comprising detecting, with a magnetic sensor, the intensity of an induced magnetic field around the harness to be measured, detecting, with an external force detecting sensor, external forces applied to the terminal fitting portion of the harness to be measured, simultaneously displaying, on a display unit, an output waveform from the magnetic sensor and an output waveform from the external force detecting sensor, and measuring the state of occurrence of a contact fault based on the magnitude of a variation in the output waveform from the magnetic sensor immediately after the external forces are applied, with respect to the output waveform from the magnetic sensor before the external forces are applied, or based on a gradient of the output waveform from the magnetic sensor immediately after the external forces are applied.

According to the present invention, there is further provided a contact fault measuring method of measuring whether or not there is a contact fault in a terminal fitting portion of a harness in a wiring system, comprising detecting, with a magnetic sensor, the intensity of an induced magnetic field around the harness to be measured, and outputting the detected intensity of the induced magnetic field to a judgment section, detecting, with an external force detecting sensor, external forces applied to the terminal fitting portion of the harness to be measured, and outputting the detected external forces to the judgment section, and measuring, with the judgment section, the state of occurrence of a contact fault based on a change in the intensity of the induced magnetic field immediately after the external forces are applied, with respect to the intensity of the induced magnetic field before the external forces are applied, or based on a rate of change in the intensity of the induced magnetic field immediately after the external forces are applied.

BRIEF DESCRIPTION OF DRAWINGS

FIG. 4 is a view showing by way of example a guidance image displayed by the contact fault measuring apparatus according to the first embodiment;

DESCRIPTION OF EMBODIMENTS

A. First Embodiment

Figure 1:
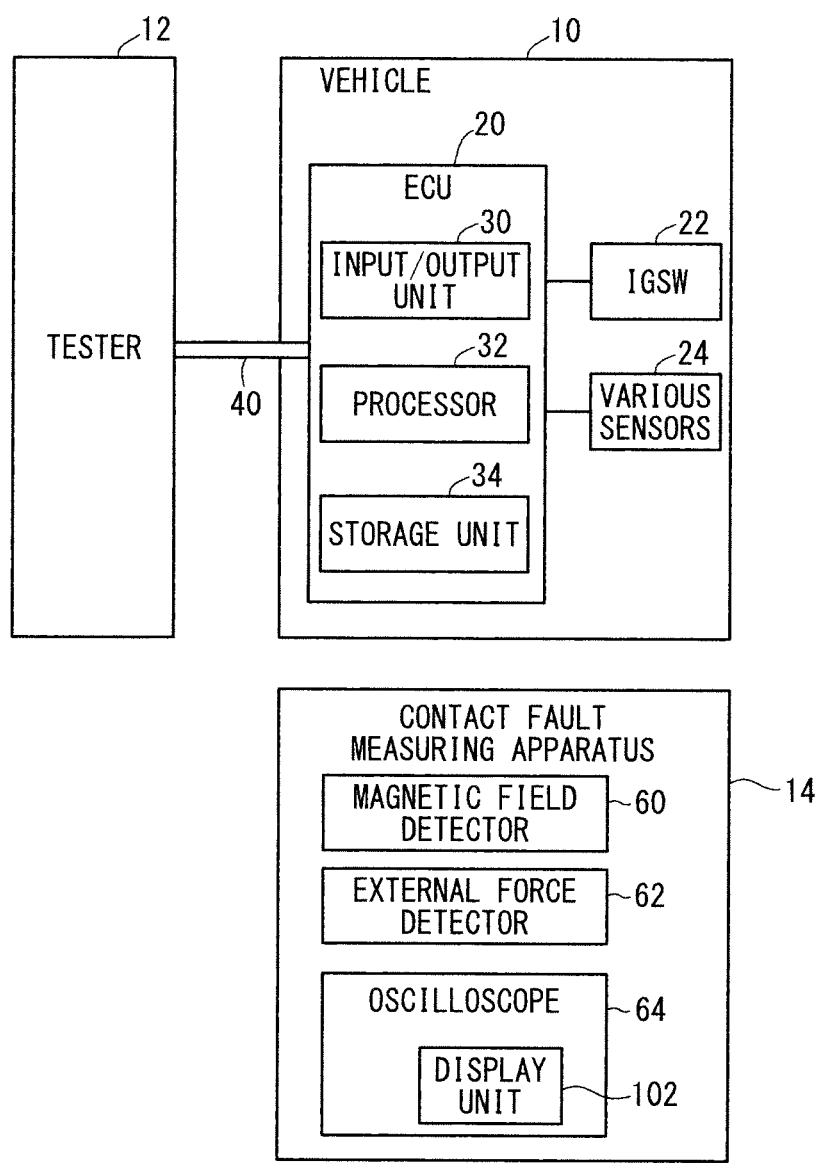
FIG. 1 is a block diagram showing a general configuration of a contact fault measuring apparatus according to a first embodiment of the present invention.

1. Configuration (1) General Configuration of Contact Fault Measuring Apparatus 14 and Peripheral Regions Thereof FIG. 1 is a block diagram showing a general configuration of a contact fault measuring apparatus 14 (hereinafter also referred to as a "measuring apparatus 14") and peripheral regions thereof according to a first embodiment of the present invention. FIG. 1 shows, in addition to the measuring apparatus 14, a vehicle 10 to be measured together with a tester 12 for inspecting the vehicle 10. Although only one vehicle 10, one tester 12, and one measuring apparatus 14 are illustrated in FIG. 1, plural vehicles 10, plural testers 12, and plural measuring apparatus 14 may be employed.

(2) Vehicle 10

The vehicle 10 has an electronic control unit 20 (hereinafter also referred to as an "ECU 20"), an ignition switch 22 (hereinafter also referred to as an "IGSW 22") for turning on and off the ECU 20, and various sensors 24. The ECU 20 controls an engine, a transmission, a brake, etc., and includes an input/output unit 30, a processor 32, and a storage unit 34.

(3) Tester 12

The tester 12 is used in the inspection of various parts of the vehicle 10 as a communication interface, which is connected to the ECU 20 of the vehicle 10 for reading data of the vehicle 10 in dealers, repair shops, etc. The tester 12 is connected to the ECU 20 by a cable 40. The tester 12 is capable of reading fault codes required to diagnose faults from the ECU 20.

(4) Contact Fault Measuring Apparatus 14

(1) Overall Configuration of Measuring Apparatus 14

Figure 2:
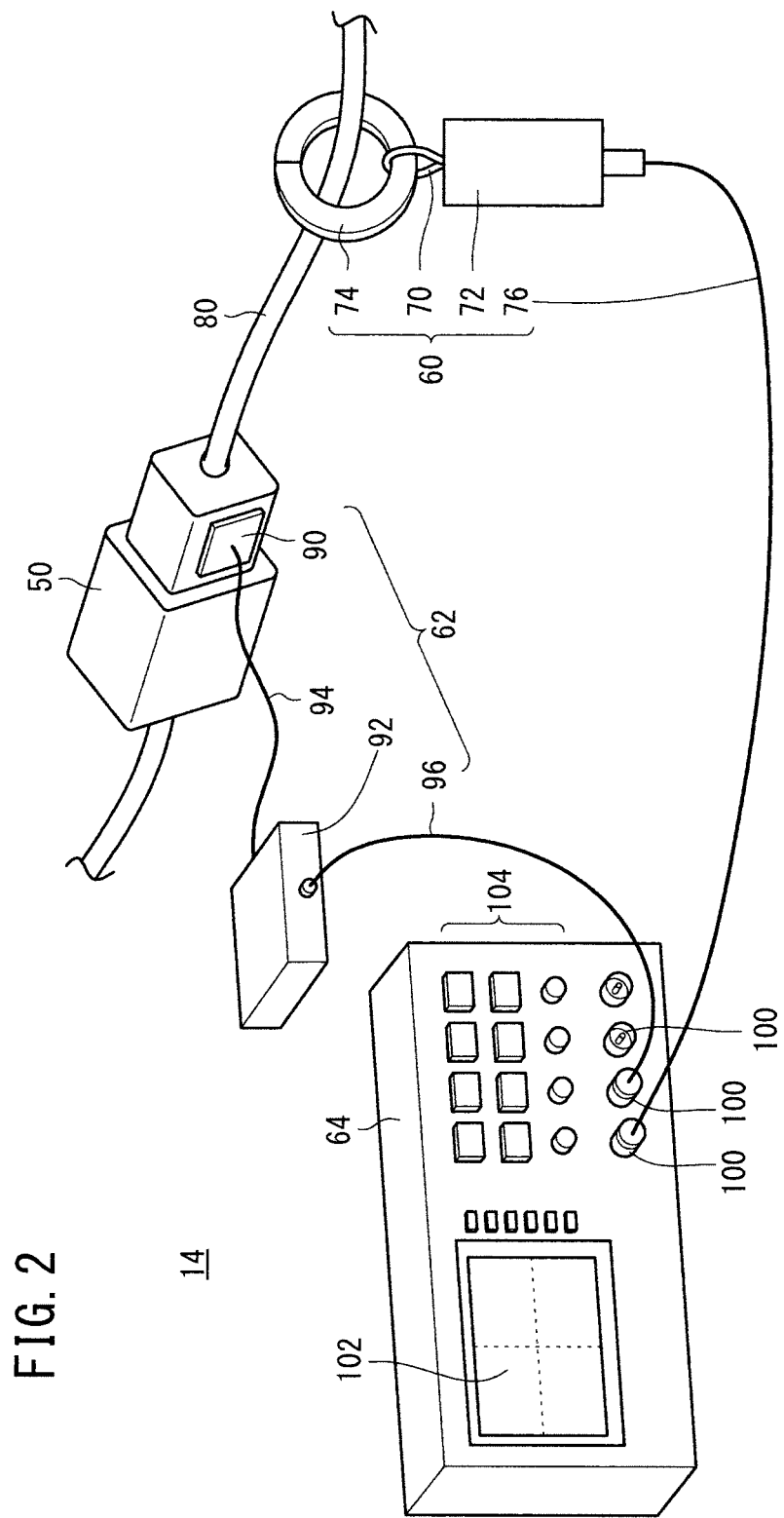
FIG. 2 is a view showing the manner in which a contact fault is measured using the contact fault measuring apparatus.

FIG. 2 is a view showing the manner in which a contact fault is measured using the measuring apparatus 14. The measuring apparatus 14 measures a temporary contact fault in a plurality of couplers (terminal fitting portions) on the vehicle 10. As shown in FIGS. 1 and 2, the measuring apparatus 14 includes a magnetic field detector 60, an external force detector 62, and an oscilloscope 64.

(b) Magnetic Field Detector 60

The magnetic field detector 60 has a detecting coil 70, a signal amplifying circuit 72, a ring-shaped ferrite core 74, and a first cable 76. The detecting coil 70 serves to detect a transient response variation in an induced magnetic field around a harness 80. The detecting coil 70 comprises a coil wire wound in a single turn around the ferrite core 74. The signal amplifying circuit 72 amplifies an output signal from the detecting coil 70 (magnetic-field-rate-of-change signal Sm) by a given amplification factor (e.g., 10) and sends the amplified signal to the oscilloscope 64 through the first cable 76. The magnetic-field-rate-of-change signal Sm is directly indicative of a detected value D1 (intensity of the induced magnetic field) from the detecting coil 70, and also indicates a transient response variation (magnetic-field rate-of-change) based on a succession of detected values D1. The ferrite core 74 comprises two split cores, which are combined together with the harness 80 extending therethrough, for preventing noise disturbances from being introduced into the detecting coil 70.

(c) External Force Detector 62

The external force detector 62 has an acceleration sensor 90, a drive circuit 92 for the acceleration sensor 90, a second cable 94 interconnecting the acceleration sensor 90 and the drive circuit 92, and a third cable interconnecting the drive circuit 92 and the oscilloscope 64.

The acceleration sensor 90, which is mounted on a coupler 50 to be measured, detects vibrations of the coupler 50. The acceleration sensor 90 is capable of detecting accelerations along a direction in which an external force is applied, and detects accelerations along a direction of at least one axis. If the acceleration sensor 90 detects accelerations along a plurality of axes, then the acceleration sensor 90 may add or multiply the detected acceleration values along the axes and output the result thereof. In FIG. 2, the acceleration sensor 90 is shown as being attached to the coupler 50. However, the acceleration sensor 90 may be mounted in place on the coupler 50 by any of various known means, such as a clip that is integrally combined with the acceleration sensor 90 and which grips the side surfaces of the coupler 50.

The drive circuit 92 supplies electric power to the acceleration sensor 90. The drive circuit 92 amplifies an output signal (acceleration signal Sa) from the acceleration sensor 90, and outputs the amplified signal to the oscilloscope 64.

(d) Oscilloscope 64

The oscilloscope 64 is of a commercially available type, and has a plurality of input terminals 100, a display unit 102, and an operating section 104. The oscilloscope 64 is capable of displaying input signals from the input terminals 100 as vertically spaced parallel data along the same time axis (see, for example, FIG. 7).

2. Flow of Repair Process (1) Overall Flow

Figure 3:
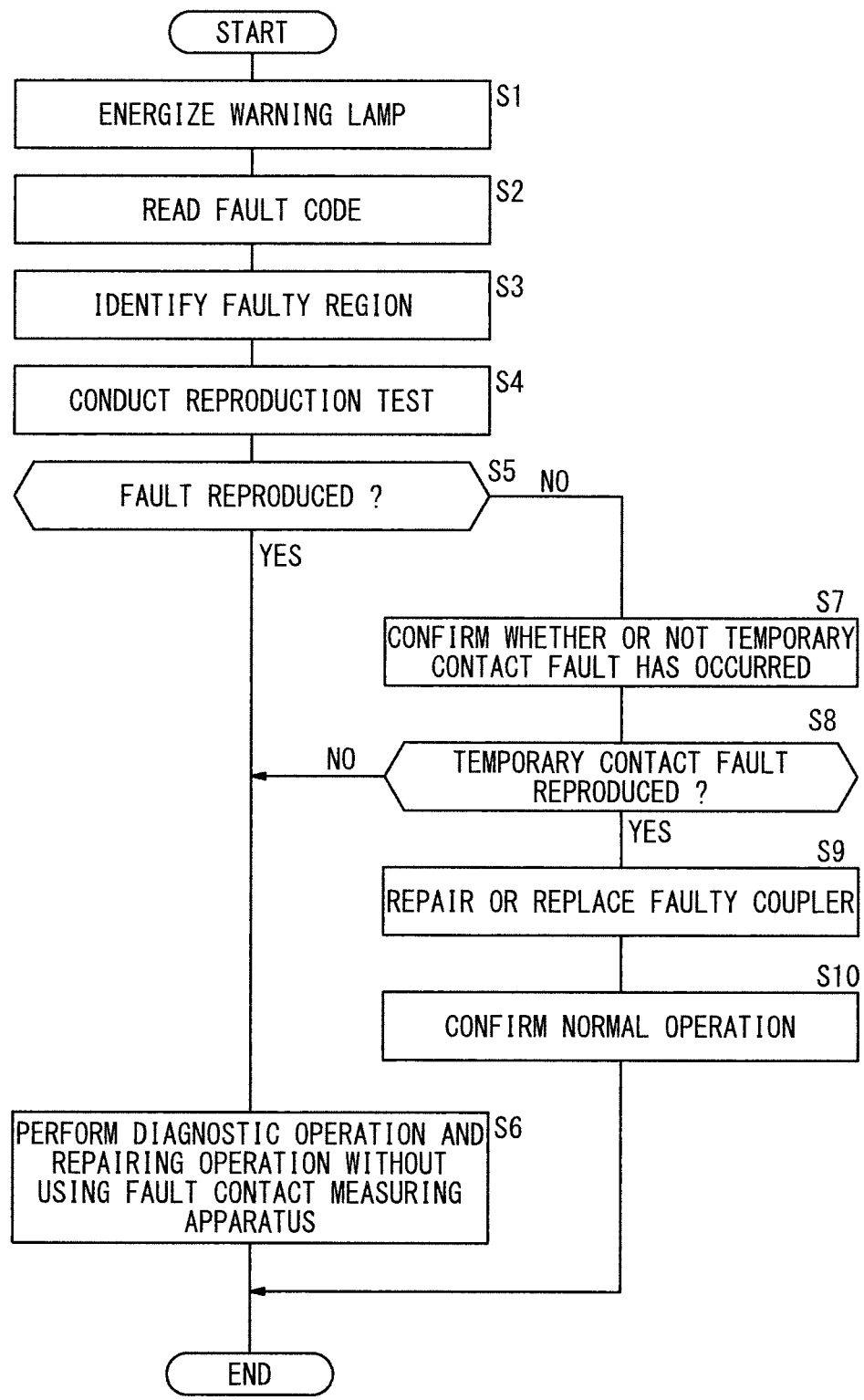
FIG. 3 is a flowchart of an overall repair process according to the first embodiment.

FIG. 3 is a flowchart of an overall repair process according to the first embodiment. In the event of an abnormality in the vehicle 10, in step S1, the ECU 20 energizes a warning lamp (not shown) on a meter, and saves a fault code (DTC: Diagnostic Trouble Code). The customer who has observed energization of the warning lamp recognizes the abnormality, and takes the vehicle 10 to the repair department of a dealer or the like. The fault code represents a fault event (e.g., the content of an abnormality occurring in the output value of a sensor).

In step S2, the repair worker (user) in the repair department connects the tester 12 to the ECU 20 with the cable 40, and operates an operating section (not shown) to read the fault code.

In step S3, the user looks for a description of a diagnostic process and a repair process concerning the read fault code in a service manual, and identifies a region (faulty region) to be diagnosed. For example, if the fault code read in step S2 is "P0102", which represents a fault event indicative of a low air flow meter voltage, then the service manual contains a description 110 as shown in FIG. 4. In FIG. 4, the phrase "DTC P0102: Air flow meter voltage is low" represents the description of the fault code, the phrases "Note: Record . . . and confirm . . . prior to fault diagnosis" and "Reproduction test −1. Turn on . . . −2. Confirm . . . " represent details of the diagnostic process and the faulty region, and the phrase "Whether roughly 0.1 V or lower . . . between ECU and air flow meter" represents a subsequent process depending on the diagnostic result.

In step S4, the user conducts a reproduction test based on the description 110. In step S5, the user confirms whether or not the fault is reproduced (=whether roughly 0.1 V or lower is indicated). For example, according to the description 110 shown in FIG. 4, the user turns on the IGSW 22 and confirms an air flow sensor (included among the various sensors 24 shown in FIG. 1) in a data list with the tester 12. If the output signal from the tester 12 does not indicate roughly 0.1 V or lower, then since the fault is not reproduced, the user determines that the coupler 50 between the ECU 20 and the air flow meter (not shown) may possibly be suffering from a temporary contact fault.

If the fault is reproduced (=roughly 0.1 V or lower is indicated) in step S5 (S5: YES), then in step S6, the user performs a normal diagnostic operation and a normal repair operation, which correspond to the reproduced fault, without using the measuring apparatus 14.

If the fault is not reproduced in step S5 (S5: NO), then in step S7, the user confirms whether or not a temporary contact fault has occurred using the measuring apparatus 14. For example, if the coupler 50 between the ECU 20 and the air flow meter (not shown) is possibly suffering from a temporary contact fault (see FIG. 4), then the user confirms whether or not a temporary contact fault has occurred with respect to each of the couplers 50 between the ECU 20 and the air flow meter. (A process of confirming whether or not a temporary contact fault has occurred will be described below.)

If the temporary contact fault in either one of the couplers 50 is reproduced as a result of the process of step S7 (S8: YES), then in step S9, the user repairs or replaces the coupler 50 in which the temporary contact fault has been reproduced. In step S10, the user confirms normal operation of the coupler 50 (confirms that the temporary contact fault has been eliminated). If the fault has not been eliminated or another fault has occurred even though the coupler 50 has been repaired or replaced in step S9, then the sequence from step S9 is carried out again.

If the temporary contact fault in either one of the couplers 50 is not reproduced (S8: NO), then the diagnostic process using the measuring apparatus 14 is completed, and control proceeds to step S6, in which the normal diagnostic operation and the normal repair operation are carried out.

(2) Process of Confirming Whether or not a Temporary Contact Fault has Occurred

Figure 5:
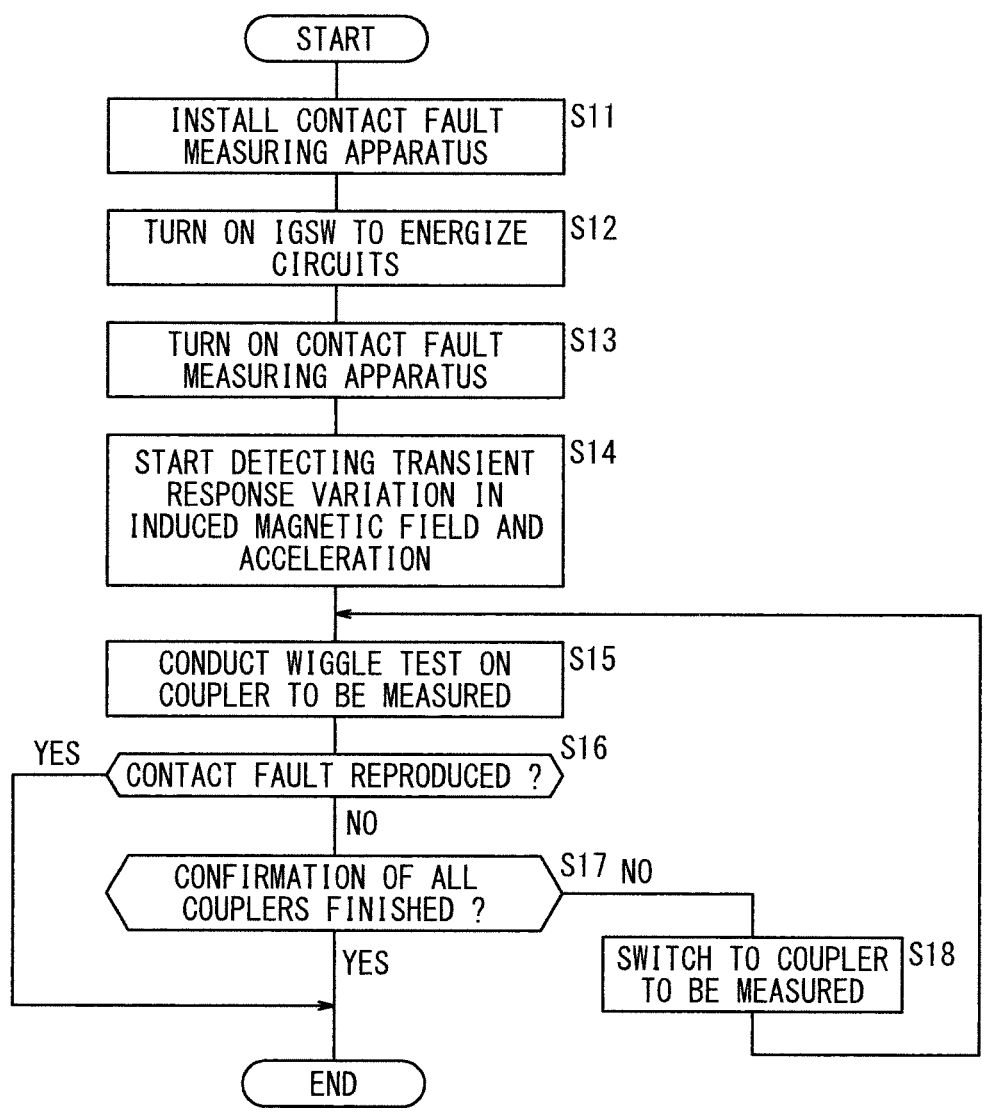
FIG. 5 is a flowchart of a user operation sequence and a processing sequence of the contact fault measuring apparatus, for confirming the occurrence of a temporary contact fault according to the first embodiment.
Figure 6:
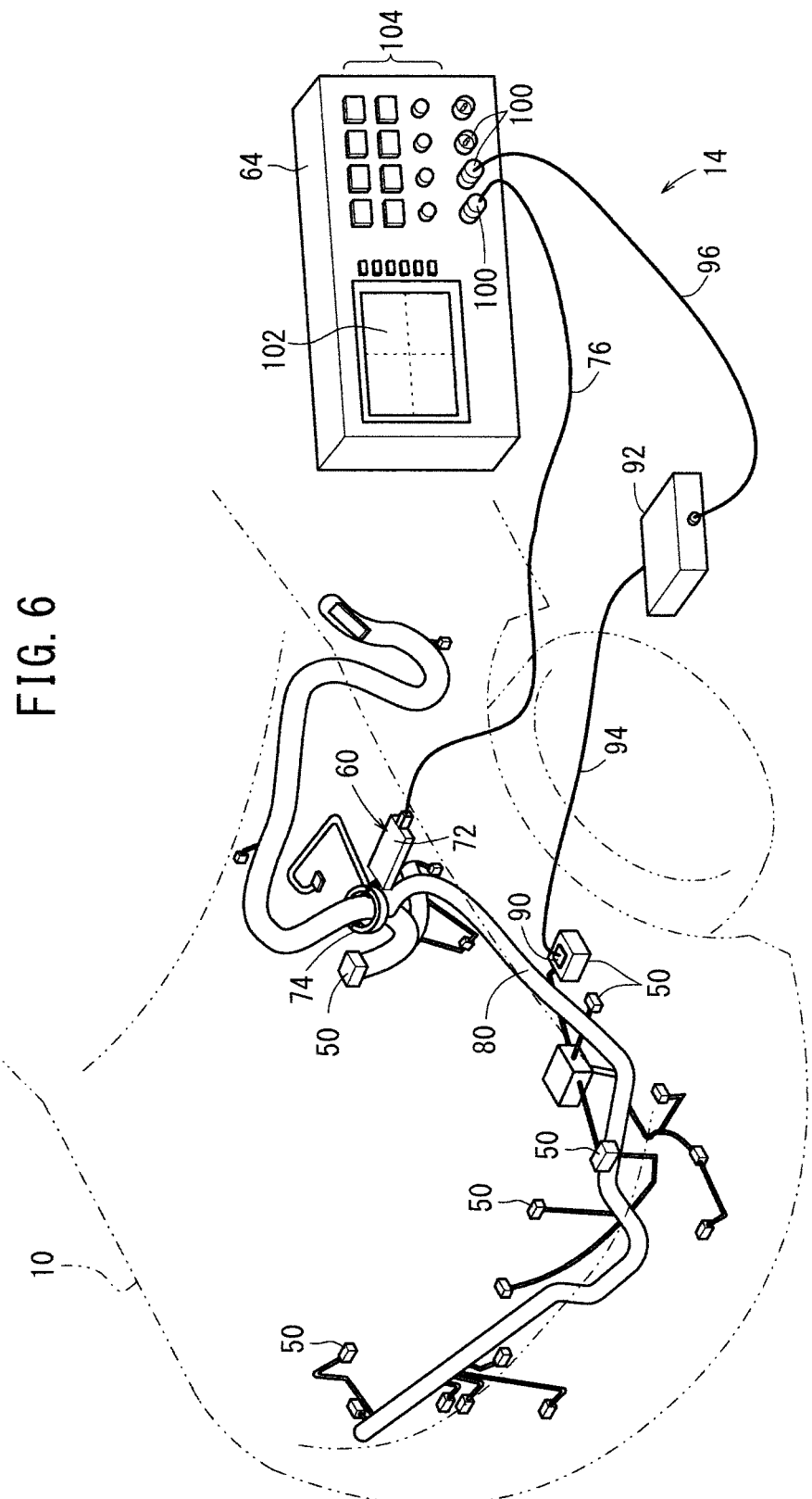
FIG. 6 is a view showing the contact fault measuring apparatus according to the first embodiment, which is installed in a vehicle for confirming the occurrence of a temporary contact fault.

FIG. 5 is a flowchart of a user operation sequence and a processing sequence of the contact fault measuring apparatus 14 for confirming the occurrence of a temporary contact fault. Stated otherwise, the operational details and processing details shown in FIG. 5 correspond to step S7 shown in FIG. 3. FIG. 6 is a view showing the measuring apparatus 14, which is installed in the vehicle for confirming the occurrence of a temporary contact fault.

In step S11, the user installs the measuring apparatus 14 in preparation for confirming the occurrence of a temporary contact fault. More specifically, as shown in FIGS. 2 and 6, the user places the detecting coil 70 and the ferrite core 74 of the magnetic field detector 60 selectively in a position on the harness 80 in a wiring system to be measured. The position where the detecting coil 70 and the ferrite core 74 are placed may be any position on the harness 80, insofar as the position is electrically connected to a wire to be measured. The user places the ferrite core 74 so as to encircle the harness 80. The user then secures the acceleration sensor 90 to the coupler 50 to be measured. The user also connects the first cable 76 and the third cable 96 to desired ones of the input terminals 100 of the oscilloscope 64.

In step S12, the user turns on the IGSW 22, thereby energizing the circuits (including the ECU 20 and the harness 80) on the vehicle 10. At this time, the user does not start the engine (not shown). The instant that a temporary disconnection occurs due to a contact fault, or when contact is reestablished, a magnetic field can be generated due to a transient response current in the harness 80 near the detecting coil 70.

In step S13, the user operates power supply switches (not shown) of the signal amplifying circuit 72 and the drive circuit 92 to turn on the detecting coil 70 and the acceleration sensor 90. The user also operates a power supply switch (not shown) of the oscilloscope 64 to turn on the oscilloscope 64.

In step S14, the magnetic field detector 60 starts to detect the magnitude of a transient response variation in an induced magnetic field (or more directly, the intensity of an induced magnetic field) around the harness 80, and the external force detector 62 starts to detect an acceleration of the coupler 50 to be measured. As a result, the magnetic field detector 60 outputs a signal representative of the transient response variation in the induced magnetic field around the harness 80 (magnetic-field-rate-of-change signal Sm) to the oscilloscope 64, and the external force detector 62 outputs a signal representative of the acceleration of the coupler 50 (acceleration signal Sa) to the oscilloscope 64. The oscilloscope 64 then displays on the display unit 102 the respective waveforms of the magnetic-field-rate-of-change signal Sm and the acceleration signal Sa.

If the harness 80 has a normal signal transmitting capability or suffers from a complete disconnection, then the intensity of the induced magnetic field around the harness 80 remains substantially constant, causing essentially no transient response variation. Unless vibrations are applied to the coupler 50, the acceleration sensor 90 remains still. At this time, therefore, the magnetic-field-rate-of-change signal Sm and the acceleration signal Sa produce respective waveforms, as shown in FIG. 7, for example.

Figure 7:
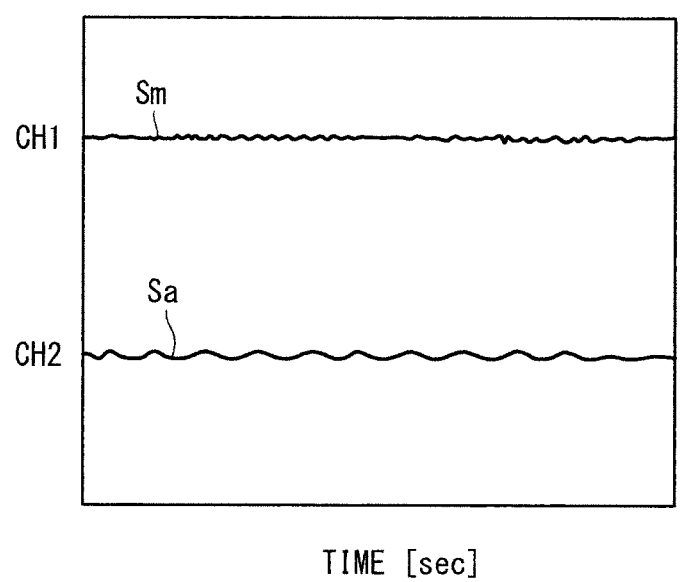
FIG. 7 is a diagram showing by way of example output signals (representing waveforms displayed on the display screen of an oscilloscope) from a magnetic field detector and an external force detector prior to performing a wiggle test (i.e., when a temporary contact fault does not occur)

In FIG. 7, the magnetic-field-rate-of-change signal Sm and the acceleration signal Sa undergo relatively small variations. The magnetic-field-rate-of-change signal Sm undergoes relatively small variations because the intensity of the induced magnetic field around the harness 80 is substantially constant, as described above. The acceleration signal Sa undergoes relatively small variations because the coupler 50 to be measured is currently in a still or non-moving state, as described above.

Figure 8:
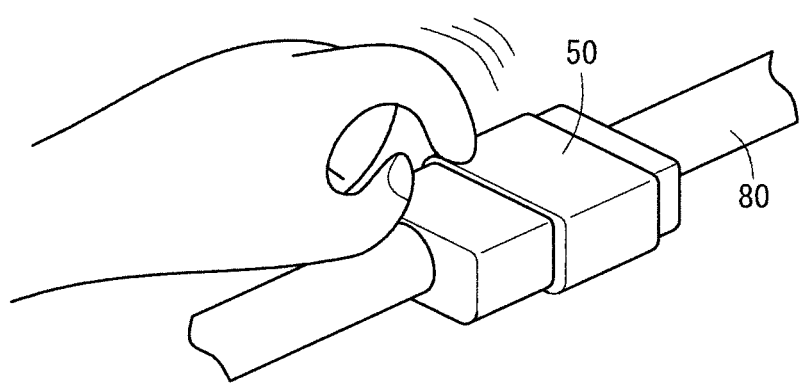
FIG. 8 is a view showing the manner in which the wiggle test is conducted.

In step S15, the user conducts a wiggle test on the coupler 50 to be measured. If the wiring system to be measured includes a plurality of couplers 50, which may possibly suffer from contact faults, then the user conducts a wiggle test successively on the couplers 50 to be measured. The wiggle test refers to a test for vibrating the coupler 50 or the harness 80 to reproduce a contact fault (see FIG. 8). According to the first embodiment, the user taps his or her finger on the coupler 50 or the harness 80 to produce vibrations thereon. However, a manual tool such as a resin-made hammer or an automatic device including an actuator may be used to produce vibrations on the coupler 50 or the harness 80.

Figure 9:
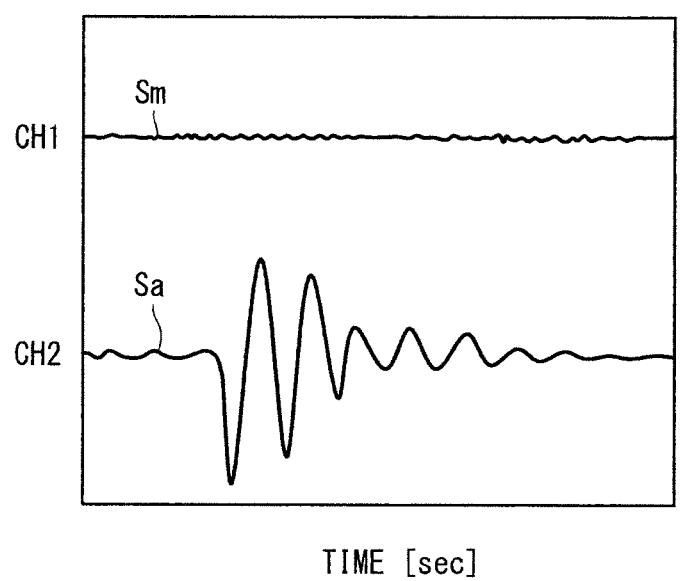
FIG. 9 is a diagram showing by way of example output signals (representing waveforms displayed on the display screen of an oscilloscope) from the magnetic field detector and the external force detector when a contact fault does not occur (i.e., when a temporary contact fault does not occur) even if a coupler is vibrated in the wiggle test.

If no contact fault occurs (a temporary failure does not occur) despite the vibrations imparted to the coupler 50 in the wiggle test, then the magnitude of the transient response variation in the induced magnetic field around the harness 80 essentially does not change, even though the coupler 50 is displaced. Therefore, when the vibrations are imparted to the coupler 50 in the wiggle test, the magnetic-field-rate-of-change signal Sm and the acceleration signal Sa produce respective waveforms, as shown in FIG. 9, for example. In FIG. 9, the transient response variation of the acceleration signal Sm becomes larger, however, the transient response variation of the magnetic-field-rate-of-change signal Sm remains small.

Figure 10:
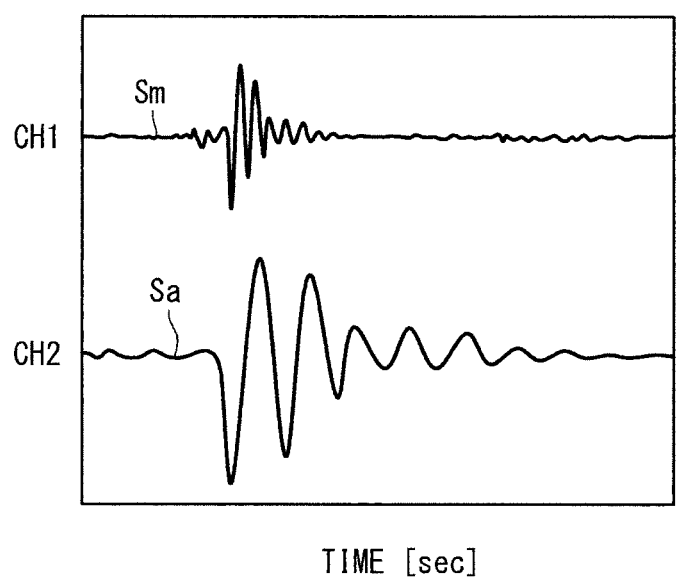
FIG. 10 is a diagram showing by way of example output signals (representing waveforms displayed on the display screen of an oscilloscope) from the magnetic field detector and the external force detector when a contact fault occurs (is reproduced) (i.e., when a temporary contact fault occurs) if the coupler is vibrated in the wiggle test.

If a contact fault occurs (is reproduced) on account of vibrations imparted to the coupler 50 during the wiggle test, then the coupler 50 is displaced and the magnitude of the transient response variation in the induced magnetic field around the harness 80 changes significantly. Therefore, when vibrations are imparted to the coupler 50 in the wiggle test, the magnetic-field-rate-of-change signal Sm and the acceleration signal Sa produce respective waveforms, as shown in FIG. 10, for example. In FIG. 10, the transient response variation of the acceleration signal Sa and the transient response variation of the magnetic-field-rate-of-change signal Sm both become greater temporarily.

Consequently, the user can judge whether or not there is a temporary contact fault by observing the magnitude of the transient response variation of the magnetic-field-rate-of-change signal Sm (at least one of an amplitude, a peak value, a bottom value, a gradient of the waveform, e.g., an average value or envelope, and the shape of the waveform) at the time that the magnitude of the transient response variation of the acceleration signal Sa (at least one of the amplitude, the peak value, the bottom value, the gradient of the waveform, e.g., an average value or envelope, or the shape of the waveform) changes significantly in the wiggle test.

If a contact fault is reproduced during the wiggle test in an one of the couplers 50 in step S15 shown in FIG. 5 (S16: YES), then the user operation sequence and the processing sequence shown in FIG. 5 are brought to an end, and control proceeds to step S9 shown in FIG. 3. If no contact fault is reproduced during the wiggle test in any one of the couplers 50 in step S15 (S16: NO), then in step S17, the user judges whether or not all the couplers 50 to be checked for the occurrence of a contact fault have been checked. If there is a coupler 50 remaining to be confirmed (S17: NO), then in step S18, the user switches to the coupler 50 to be confirmed. More specifically, the user installs the acceleration sensor 90 on the coupler 50 to be newly measured. Then, control returns to step S15.

When the user switches to another coupler 50 to be measured, the user needs to move the acceleration sensor 90, but does not need to move the detecting coil 70. This is because, insofar as the harness 80, which is closely associated with the detecting coil 70, is electrically connected to the coupler 50 to be measured, when a contact fault is reproduced in the coupler 50 to be measured, the intensity of the induced magnetic field around the harness 80 changes, thereby increasing the transient response variation.

If all the couplers 50 to be checked for the occurrence of a contact fault have been checked (S17: YES), then the user operation sequence and the processing sequence shown in FIG. 5 are brought to an end, and control proceeds to step S6 shown in FIG. 3.

3. Advantages of the First Embodiment

According to the first embodiment, as described above, upon the occurrence of an abnormality, it is possible to judge whether or not there is a contact fault in the coupler 50 (terminal fitting portion) while the coupler 50 remains connected. More specifically, if temporarily there is no contact fault even though the coupler 50 is unstably connected, then a current flows through the coupler 50 before external forces are applied to the coupler 50. However, when external forces are applied to the coupler 50, thereby causing a contact fault in the unstably connected region of the coupler 50, which instantaneously stops current from flowing, the intensity of the induced magnetic field around the harness 80 including the coupler 50 is temporarily changed significantly (i.e., the transient response variation becomes greater). According to the first embodiment, the transient response variation in the induced magnetic field around the harness 80 at the time external forces are applied to the coupler 50 is detected, and the oscilloscope 64 displays the waveform of the magnetic-field-rate-of-change signal Sm on the display unit 102. Accordingly, without any need for separating the coupler 50, i.e., while the coupler 50 remains connected upon the occurrence of an abnormality, it is possible to judge whether or not there is a contact fault in the coupler 50 based on the displayed waveform of the magnetic-field-rate-of-change signal Sm.

The phenomenon in which the transient response variation in the induced magnetic field becomes temporarily larger can be detected in a region around the harness 80 that is slightly spaced from the coupler 50. Therefore, even in a space such as the engine compartment of the vehicle 10, for example, which is crammed full of wires and other components, the user can select a place for measurement where the detecting coil 70 and the ferrite core 74 of the magnetic field detector 60 can be installed with ease. Consequently, the measuring process can be performed easily.

According to the first embodiment, the display unit 102 displays the waveform of the acceleration signal Sa in addition to the waveform of the magnetic-field-rate-of-change signal Sm. Therefore, the user can identify without fail transient response variations in the induced magnetic field around the harness 80 at the time that external forces are applied to the coupler 50. In addition, it is possible to eliminate the effects of noise disturbances, magnetic field noise due to light-flux noise signals, etc.

According to the first embodiment, the acceleration sensor 90 is used as a sensor for detecting external forces applied to the coupler 50. Since the acceleration sensor 90 makes it easy to detect vibrations produced the instant that external forces are applied, it is possible to effectively detect whether or not external forces have been applied to the coupler 50.

B. Second Embodiment

1. Configuration

Figure 11:
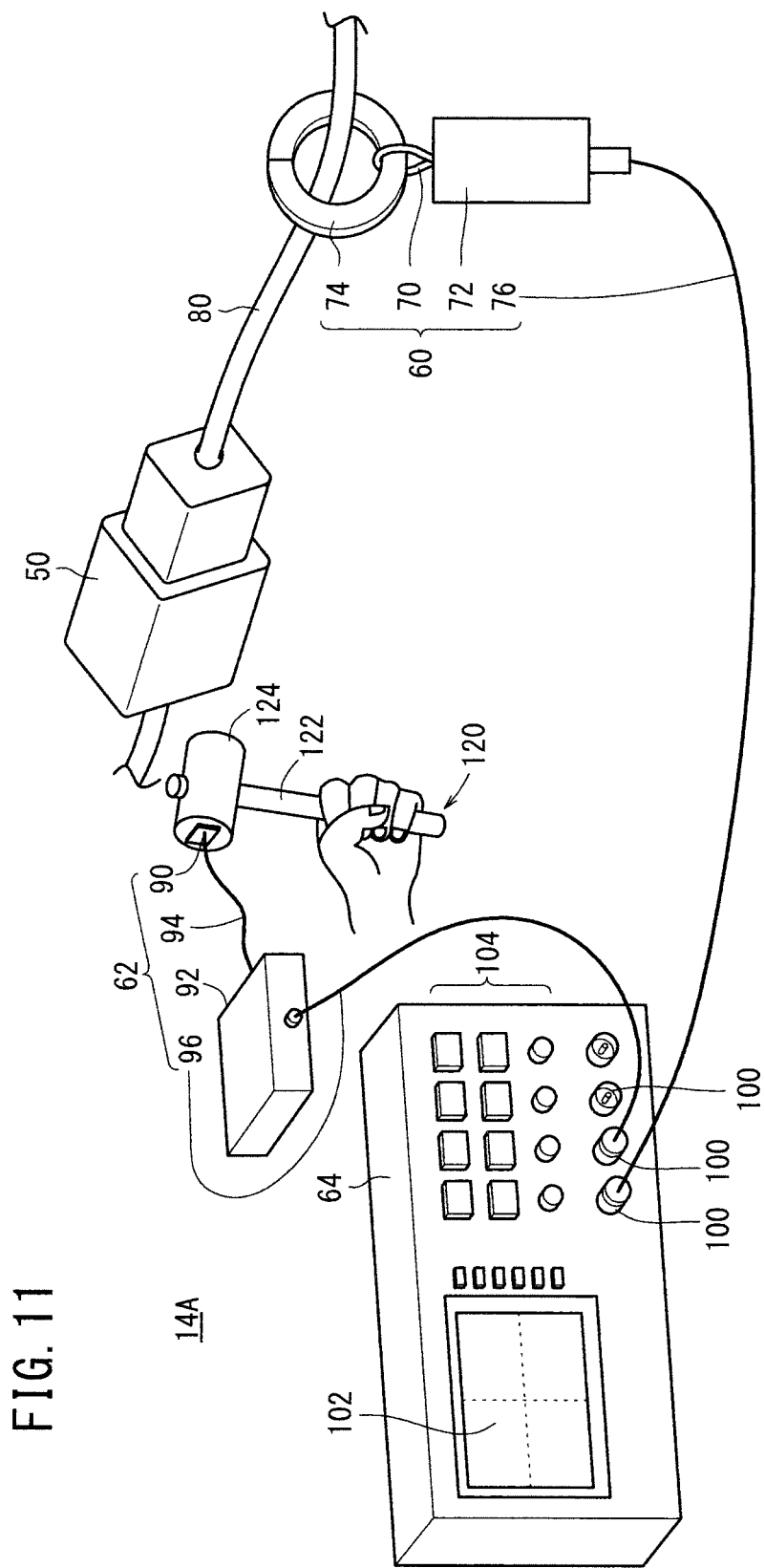
FIG. 11 is a view showing the manner in which a contact fault is measured using a contact fault measuring apparatus according to a second embodiment of the present invention.

FIG. 11 is a view showing the manner in which a contact fault is measured using a contact fault measuring apparatus 14A (hereinafter also referred to as a "measuring apparatus 14A") according to a second embodiment of the present invention. Parts of the second embodiment, which are identical to those of the first embodiment, will be denoted by identical reference characters, and such features will not be described in detail below.

The second embodiment differs from the first embodiment in that, whereas the user's finger is used to apply external forces to the coupler 50 according to the first embodiment (see FIG. 8), according to the second embodiment, a vibrating tool 120 is used to apply external forces to the coupler 50. Furthermore, whereas the acceleration sensor 90 is fixed to the coupler 50 according to the first embodiment (see FIG. 2), according to the second embodiment, the acceleration sensor 90 is fixed to the vibrating tool 120.

The vibrating tool 120 is in the shape of a small-size version of a general hammer made of resin. The vibrating tool 120 has a grip 122, which is gripped by the user, and a head 124 mounted on the tip end of the grip 122 for coming into contact with the coupler 50 by hitting the coupler 50. As shown in FIG. 11, the acceleration sensor 90 is fixed to an end of the head 124 (or in any other position thereon). The vibrating tool 120 is made of light-weight plastic. When the head 124 of the vibrating tool 120 is brought into contact with the coupler 50 by hitting the same, the grip 122 of the vibrating tool 120 flexes, thereby causing the head 124 to vibrate relatively significantly. Thus, the acceleration sensor 90 is able to detect with high accuracy the application of external forces caused by the vibrating tool 120.

2. Advantages of the Second Embodiment

The second embodiment offers the following advantages in addition to the advantages of the first embodiment.

According to the second embodiment, the vibrating tool 120 with the acceleration sensor 90 mounted thereon is used to apply external forces to the coupler 50. Since the acceleration sensor 90 is mounted on the vibrating tool 120, it is possible to detect the timing at which external forces are applied to the coupler 50, irrespective of the displacement of the coupler 50 or the harness 80. Therefore, the measuring process is easier to carry out.

C. Third Embodiment

Figure 12:
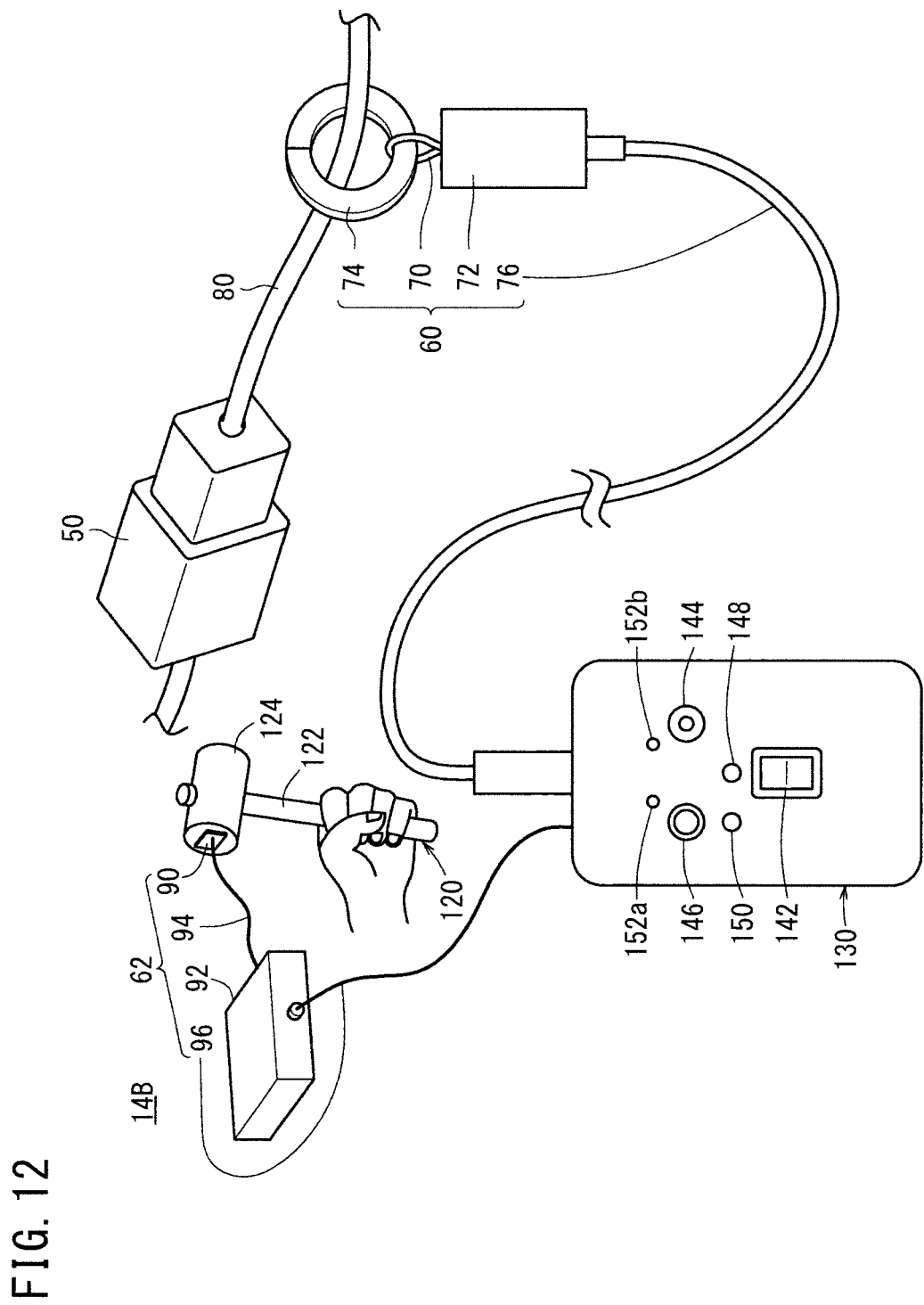
FIG. 12 is a view showing the manner in which a contact fault is measured using a contact fault measuring apparatus according to a third embodiment of the present invention.

1. Configuration (1) Differences from the First Embodiment and the Second Embodiment FIG. 12 is a view showing the manner in which a contact fault is measured using a contact fault measuring apparatus 14B (hereinafter also referred to as a "measuring apparatus 14B") according to a third embodiment of the present invention. Parts of the third embodiment, which are identical to those of the first embodiment and the second embodiment, will be denoted by identical reference characters, and such features will not be described in detail below.

The third embodiment differs from the first embodiment and the second embodiment in that, whereas the user judges whether or not there is a contact fault based on the waveforms displayed on the display unit 102 according to the first embodiment and the second embodiment, according to the third embodiment, the measuring apparatus 14B itself determines whether or not a contact fault has occurred.

The measuring apparatus 14B includes a controller 130 in addition to a magnetic field detector 60 and an external force detector 62, which are identical to those according to the first embodiment.

(2) Controller 130

Figure 13:
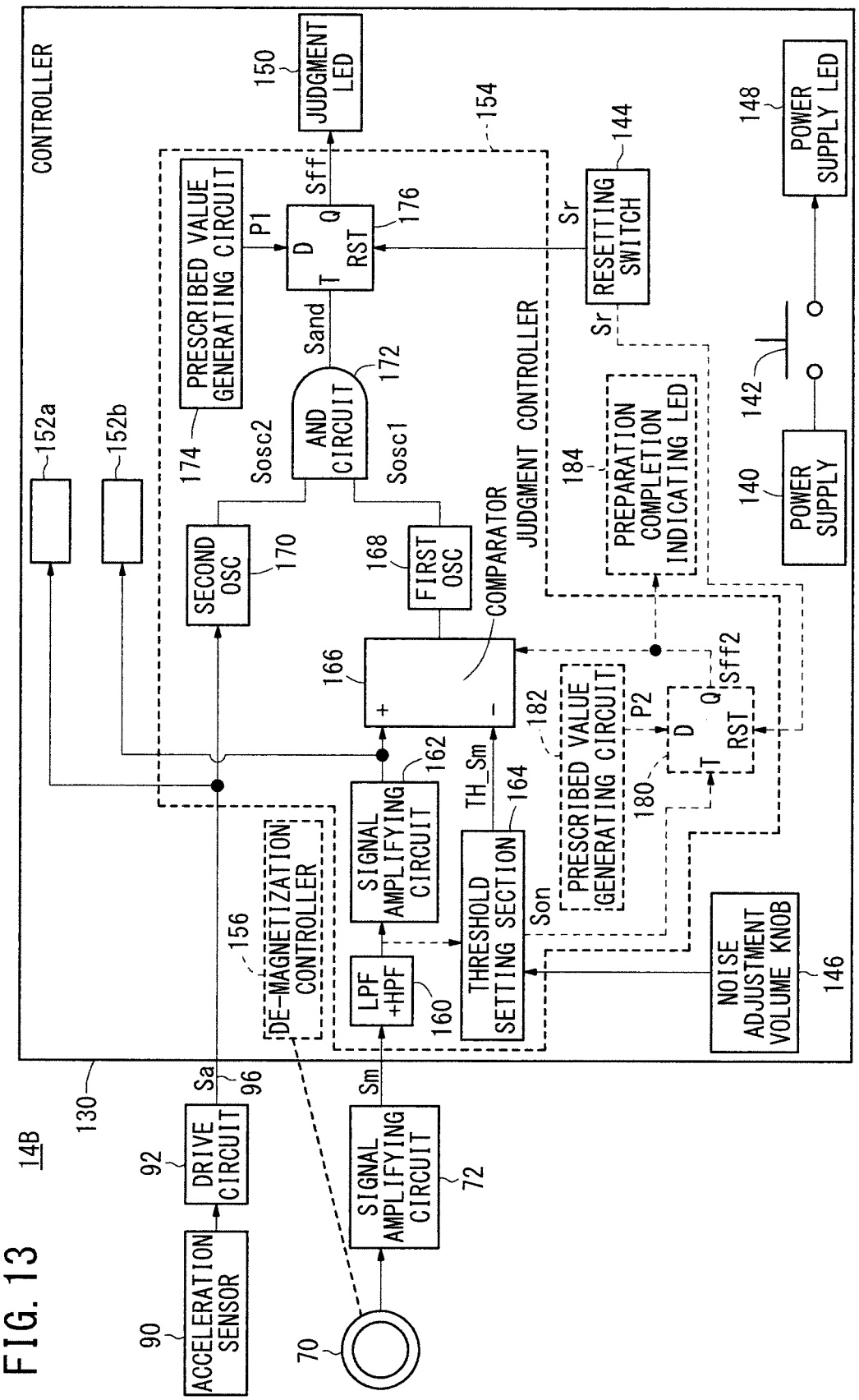
FIG. 13 is a block diagram of a controller of the contact fault measuring apparatus according to the third embodiment.

FIG. 13 is a block diagram of the controller 130 and related circuits. The controller 130 processes the magnetic-field-rate-of-change signal Sm from the magnetic field detector 60 (the detecting coil 70 and the signal amplifying circuit 72) and the acceleration signal Sa from the external force detector 62 (the acceleration sensor 90 and the drive circuit 92), produces specified output signals, and controls operation of the magnetic field detector 60 and the external force detector 62.

As shown in FIGS. 12 and 13, the controller 130 includes a power supply 140, a power supply switch 142, a resetting switch 144, a noise adjustment volume knob 146 (hereinafter also referred to as a "volume knob 146"), a power supply LED 148 (LED: Light-Emitting Diode), a judgment LED 150 (display unit), oscilloscope connection terminals 152a, 152b, a judgment controller 154, and a demagnetization controller 156.

The power supply switch 142, which comprises a seesaw switch, is used for selectively turning on and off the controller 130. The resetting switch 144, which comprises a pushbutton switch, outputs a resetting signal Sr to the judgment controller 154 and the demagnetization controller 156. The noise adjustment volume knob 146, which comprises a rotary volume knob, is used to manually adjust a threshold value TH_Sm, to be described later. The power supply LED 148 is energized when the measuring apparatus 14B is turned on, and de-energized when the measuring apparatus 14B is turned off. The judgment LED 150 is energized or de-energized depending on the detection performed by the magnetic field detector 60 (to be described in detail later). The oscilloscope connection terminals 152a, 152b are terminals for transmitting output signals from the controller 130.

As shown in FIG. 13, the judgment controller 154 includes a filter 160 comprising a combination of a low-pass filter (LPF) and a high-pass filter (HPF) for passing only signals in a transient response frequency band, a signal amplifying circuit 162, a threshold setting section 164, a comparator 166, a first one-shot circuit 168 (hereinafter also referred to as a "first OSC 168"), a second one-shot circuit 170 (hereinafter also referred to as a "second OSC 170"), an AND circuit 172, a first prescribed value generating circuit 174, and a first flip-flop circuit 176.

The filter 160 cuts off frequencies other than frequencies residing within the frequency band (transient response frequency band) of the magnetic-field-rate-of-change signal Sm, which may be generated upon the occurrence of a temporary contact fault. The signal amplifying circuit 162 amplifies an output signal from the filter 160. The threshold setting section 164 sets a threshold value TH_Sm depending on the angular displacement of the volume knob 146, and outputs the threshold value TH_Sm to the comparator 166.

As indicated by the broken-line arrows in FIG. 13, the threshold setting section 164 is supplied with the output signal from the filter 160 (or the signal amplifying circuit 162), and detects the noise level of the output signal from the filter 160 (or the signal amplifying circuit 162), whereby the threshold setting section 164 automatically sets the threshold value TH_Sm.

According to the above alternative, the threshold setting section 164 detects the noise level and automatically sets the threshold value TH_Sm. For example, the threshold setting section 164 monitors the amplitude of the output signal for a given period, and then sets a value representing the sum of the maximum level of the monitored amplitude and a prescribed value (a value that is exceeded only when a temporary contact fault occurs) as the threshold value TH_Sm. According to the above alternative, the judgment controller 154 also includes a second flip-flop circuit 180, and a second prescribed value generating circuit 182.

When the threshold setting section 164 has finished setting the threshold value TH_Sm, the threshold setting section 164 applies an ON signal Son, which is indicative of having finished setting the threshold value, to a trigger terminal T of the second flip-flop circuit 180. Up to this point, the second prescribed value generating circuit 182 has been applying a prescribed value P2 to a data terminal D of the second flip-flop circuit 180. When the ON signal Son is applied to the trigger terminal T, the second flip-flop circuit 180 outputs an output signal Sff2 (prescribed value P2) from an output terminal Q thereof. The output signal Sff2 is sent to the comparator 166 and to a preparation completion indicating LED 184.

At the time that the comparator 166 receives the output signal Sff2, the comparator 166 sets the value received from the threshold setting section 164 as a new threshold value TH_Sm (when the comparator 166 does not receive the output signal Sff2, the threshold value TH_Sm is not updated). Upon receiving the output signal Sff2, the preparation completion indicating LED 184 is energized continuously. Therefore, the user is able to know that updating of the threshold value TH_Sm is finished. Thereafter, when the user presses the resetting switch 144, a resetting signal Sr is applied to a resetting terminal RST of the second flip-flop circuit 180, which ends transmission of the output signal Sff2, whereupon the preparation completion indicating LED 184 is de-energized.

The comparator 166 compares an output value from the signal amplifying circuit 162 (the magnetic-field-rate-of-change signal Sm processed by the filter 160 and the signal amplifying circuit 162) with the threshold value TH_Sm from the threshold setting section 164. When the difference between the compared values is smaller than 0, the comparator 166 produces an output signal "L" (logic 0), and when the difference between the compared values is equal to or greater than 0, the comparator 166 produces an output signal "H" (logic 1).

The first OSC 168 and the second OSC 170 each comprise a one-shot pulse generator. More specifically, when the first OSC 168 is supplied with the output signal "L" from the comparator 166, the first OSC 168 produces an output signal Sosc1 "L". When the first OSC 168 is supplied with the output signal "H" from the comparator 166, the first OSC 168 produces an output signal Sosc1 "H" for a given period tosc1. When the second OSC 170 is supplied with an output signal (the amplitude of the acceleration signal Sa) from the drive circuit 92 that is smaller than the threshold value TH_Sa, the second OSC 170 produces an output signal Sosc2 "L" (logic 0). When the second OSC 170 is supplied with an output signal from the drive circuit 92 which is equal to or greater than the threshold value TH_Sa, the second OSC 170 produces an output signal Sosc2 "H" for a given period tosc2. The given periods tosc1, tosc2 are set to lengths that are large enough to sufficiently absorb the difference between the time for the magnetic field detector 60 to detect a magnetic field variation due to a temporary disconnection and the time for the external force detector 62 to detect vibrations. The given periods tosc1, tosc2 may be set to the same length.

When the output signal Sosc1 from the first OSC 168 and the output signal Sosc1 from the second OSC 170 are both "H", the AND circuit 172 produces an output signal Sand "H". Otherwise, the AND circuit 172 produces an output Sand "L". The first prescribed value generating circuit 174 outputs a value P1 (fixed value), which is used to turn on the judgment LED 150.

At the time that the first flip-flop circuit 176 is supplied with a voltage equal to or higher than a prescribed value at a trigger terminal T, the first flip-flop circuit 176 outputs the input value at the data terminal D from an output terminal Q thereof. When the AND circuit 172 applies the output Sand "H" to the trigger terminal T of the first flip-flop circuit 176, the input value at the data terminal D (the value P1 from the first prescribed value generating circuit 174) is output from the output terminal Q. Therefore, the first flip-flop circuit 176 outputs the value P1 from the first prescribed value generating circuit 174 only when both the magnetic field detector 60 detects a magnetic field variation (transient response variation) due to a temporary disconnection and the acceleration sensor 90 detects variations in acceleration. When the value P1 is output from the first flip-flop circuit 176, the judgment LED 150 is energized. Consequently, when external forces are applied to the coupler 50, the controller 130 automatically detects a magnetic field variation (transient response variation) due to a temporary disconnection, so that the user can determine the occurrence of the temporary disconnection based on energization of the judgment LED 150. In addition, even if noise is produced in the first cable 76, which interconnects the magnetic field detector 60 and the controller 130, the controller 130 is prevented from detecting a magnetic field variation in error.

The demagnetization controller 156 demagnetizes the detecting coil 70 when undue magnetization of the detecting coil 70 could adversely affect the detection capability of the detecting coil 70.

Figure 14:
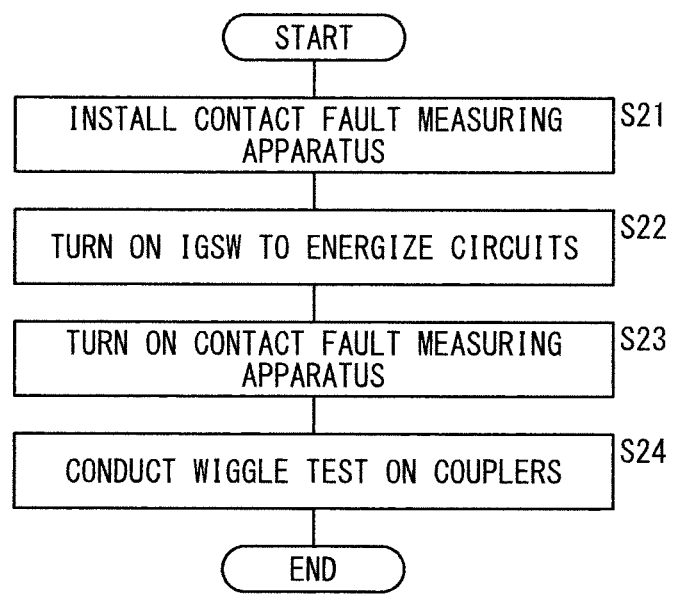
FIG. 14 is a flowchart of a user operation sequence and a processing sequence of the contact fault measuring apparatus, for confirming the occurrence of a temporary contact fault according to the third embodiment.
Figure 15:
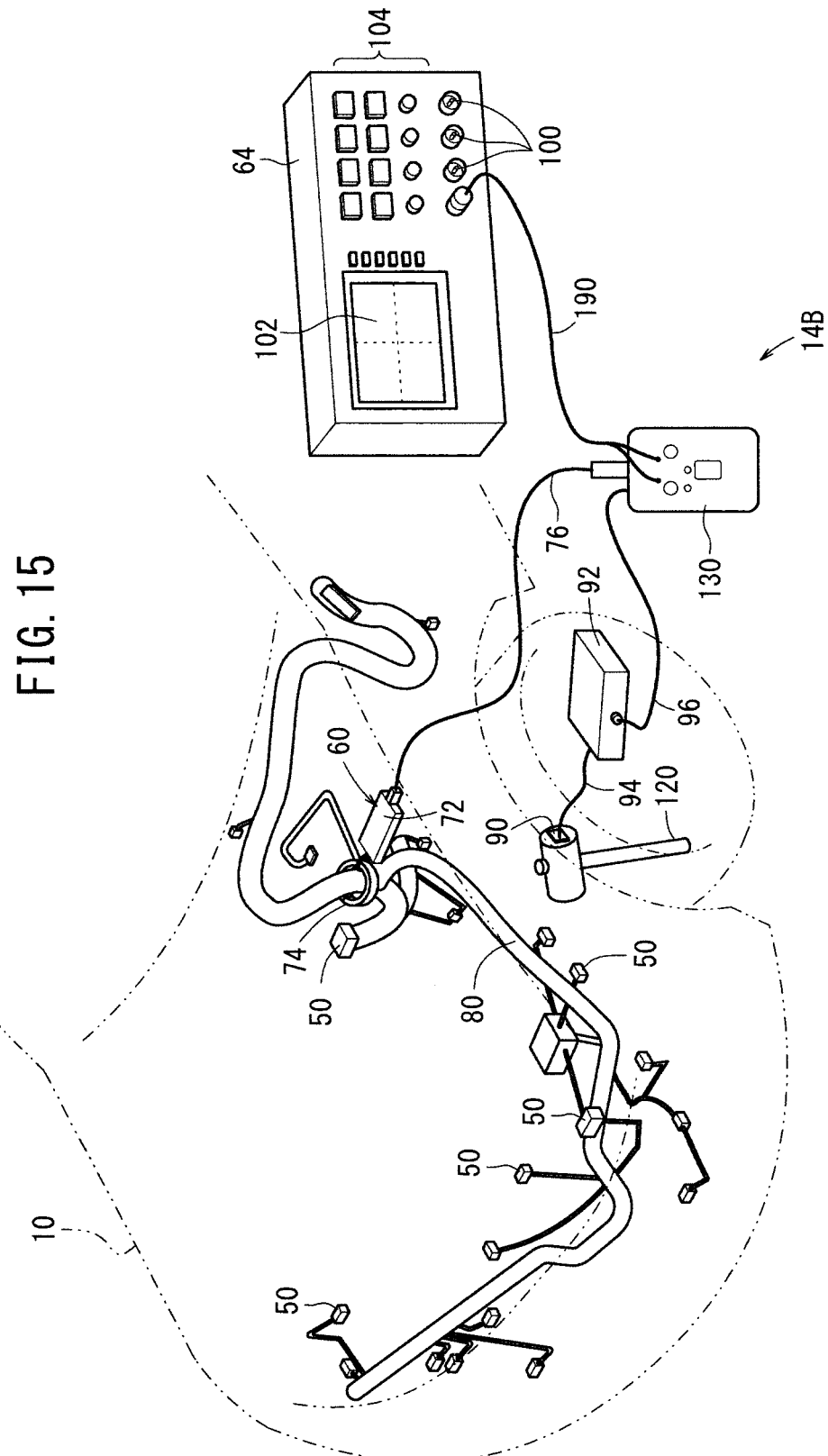
FIG. 15 is a view showing the contact fault measuring apparatus according to the third embodiment, which is installed in a vehicle for confirming the occurrence of a temporary contact fault.

2. User Operation Sequence and Processing Sequence of Contact Fault Measuring Apparatus 14b for Confirming the Occurrence of a Temporary Contact Fault FIG. 14 is a flowchart of a user operation sequence and a processing sequence of the contact fault measuring apparatus 14B for confirming the occurrence of a temporary contact fault. Stated otherwise, the operational details and processing details shown in FIG. 14 correspond to step S7 shown in FIG. 3 according to the first embodiment. FIG. 15 is a view showing the contact fault measuring apparatus 14B, which is installed in a vehicle 10, for confirming the occurrence of a temporary contact fault. As shown in FIG. 15, if necessary, the controller 130 and the oscilloscope 64 may be connected to each other by a cable 190, so that output waveforms (the magnetic-field-rate-of-change signal Sm and the acceleration signal Sa) from the controller 130 can be displayed on the display unit 102 of the oscilloscope 64.

In step S21, the user installs the measuring apparatus 14B in preparation for confirming the occurrence of a temporary contact fault. More specifically, as shown in FIGS. 12 and 15, the user places the detecting coil 70 and the ferrite core 74 of the magnetic field detector 60 selectively in a position on the harness 80 where the coupler to be measured is connected. If necessary, using the cable 190, the user may connect the oscilloscope connection terminals 152a, 152b of the controller 130 to the input terminals 100 of the oscilloscope 64.

In step S22, the user turns on the IGSW 22, thereby energizing circuits (including the ECU 20 and the harness 80) in the vehicle 10. At this time, the user does not start the engine (not shown). Further, at this time, a magnetic field is generated around the harness 80 in proximity to the detecting coil 70.

In step S23, the user operates the power supply switch 142 of the controller 130, thereby turning on the measuring apparatus 14B. As a result, the power supply 140 supplies electric power to the power supply LED 148, which energizes the power supply LED 148. The judgment controller 154 receives the magnetic-field-rate-of-change signal Sm from the magnetic field detector 60 as well as the acceleration signal Sa from the external force detector 62, and outputs a judgment result to the judgment LED 150. The threshold value TH_Sm used by the comparator 166 of the judgment controller 154 may be adjusted manually by the user using the noise adjustment volume knob 146. The second flip-flop circuit 180, the second prescribed value generating circuit 182, and the preparation completion indicating LED 184 also allow the threshold value TH_Sm to be automatically adjusted.

If the measuring apparatus 14B and the oscilloscope 64 are connected to each other, then the magnetic-field-rate-of-change signal Sm and the acceleration signal Sa are sent from the oscilloscope connection terminals 152a, 152b to the oscilloscope 64. Waveforms of the magnetic-field-rate-of-change signal Sm and the acceleration signal Sa are displayed on the display unit 102 of the oscilloscope 64. At this time, the user may operate the operating section 104 of the oscilloscope 64 in order to adjust the displayed data (time axis, amplitudes, etc.) that is output to the display unit 102.

Figure 16:
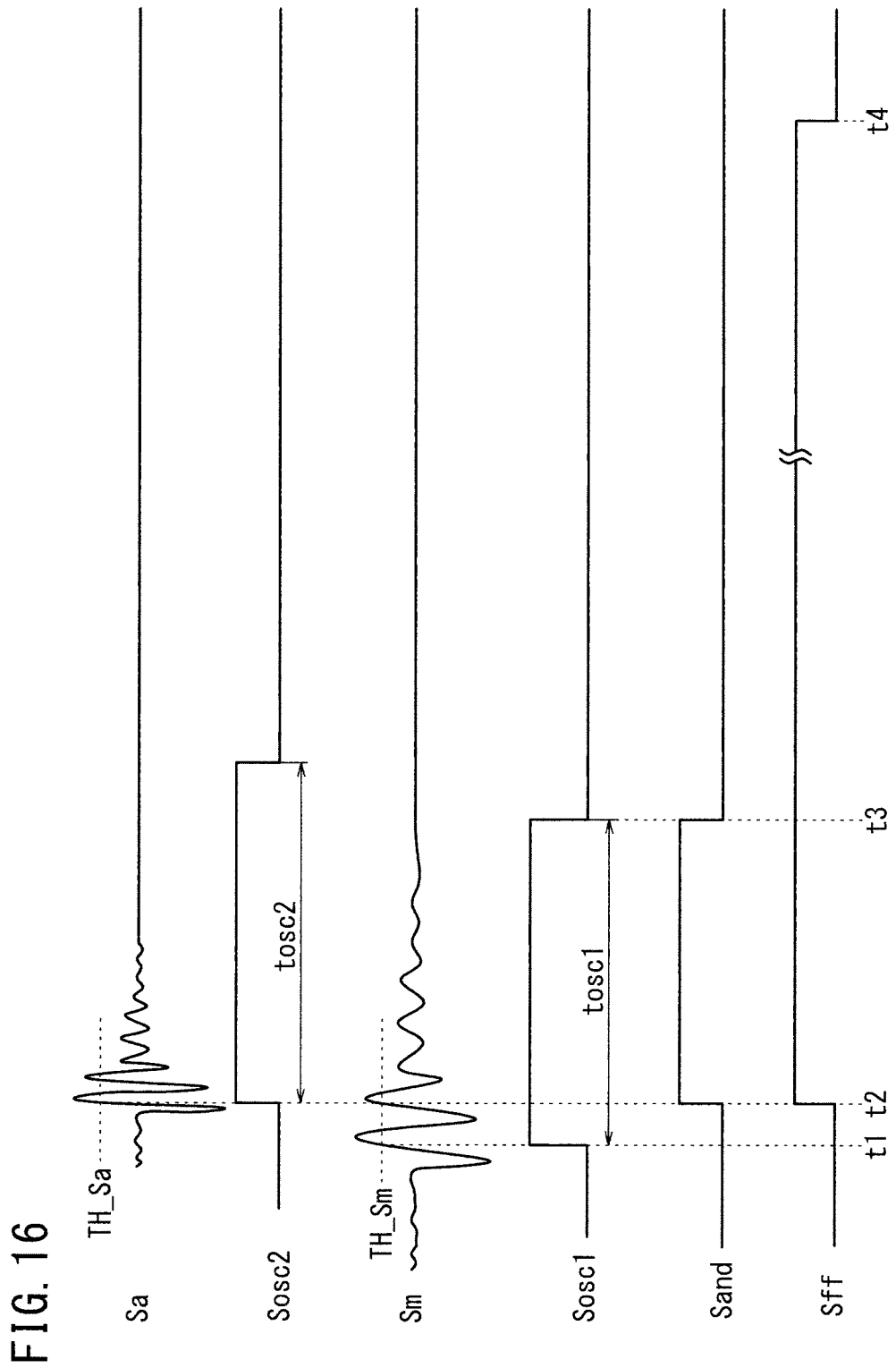
FIG. 16 is a diagram showing by way of example various signals generated in the third embodiment.

In step S24, the user conducts a wiggle test on each of the couplers 50. According to the third embodiment, the user operates the vibrating tool 120 to vibrate the coupler 50 to be measured (i.e., to exert external forces thereto). As shown in FIG. 16, for example, the acceleration signal Sa from the external force detector 62 exceeds the threshold value TH_Sa (at time t2). The second OSC 170 produces an output signal Sosc2 "H" for a given period tosc2 from the time that the acceleration signal Sa exceeds the threshold value TH_Sa (time t2).

If no temporary contact fault (disconnection) is reproduced even when the user operates the vibrating tool 120 to vibrate the coupler 50 to be measured, then the amplitude of the magnetic-field-rate-of-change signal Sm from the magnetic field detector 60 does not change significantly and the amplitude of the magnetic-field-rate-of-change signal Sm (the magnetic-field-rate-of-change signal Sm processed by the filter 160 and the signal amplifying circuit 162) does not exceed the threshold value TH_Sm. Therefore, the output signal from the comparator 166 remains "H" and the output signal Sosc1 from the first OSC 168 remains "L". Therefore, the output signal Sand from the AND circuit 172 also remains "L". Since the output signal Sff from the flip-flop circuit 176 is "L", the judgment LED 150 remains de-energized in order to notify the user that no contact fault is reproduced.

If a temporary contact fault (disconnection) is reproduced when the user operates the vibrating tool 120 in order to vibrate (i.e., apply external forces to) the coupler 50 to be measured, then as shown in FIG. 16, for example, the magnetic-field-rate-of-change signal Sm from the magnetic field detector 60 exceeds the threshold value TH_Sm (at time t1).

Therefore, the first OSC 168 produces an output signal Sosc1 "H" for a given period tosc1 from the time that the magnetic-field-rate-of-change signal Sm exceeds the threshold value TH_Sm (time t1).

The AND circuit 172 produces an output signal Sand "H" when both the output signal Sosc1 from the first OSC 168 and the output signal Sosc2 from the second OSC 170 are "H" (from time t2 to time t3 in FIG. 16). When the output signal Sand from the AND circuit 172 is "H", a voltage signal, which is equal to or higher than a prescribed value, is applied to the trigger terminal T of the flip-flop circuit 176. As a result, the flip-flop circuit 176 produces an output signal Sff "H" (value P1), thereby energizing the judgment LED 150 to notify the user that a contact fault is reproduced.

When the user presses the resetting switch 144 while the judgment LED 150 is energized, the flip-flop circuit 176 produces an output signal Sff "L", thereby de-energizing the judgment LED 150 (time t4).

As described above with respect to the first embodiment, the user conducts a wiggle test successively on the couplers 50 or the harness 80 for thereby confirming the occurrence of a contact fault with respect to the couplers 50.

3. Advantages of the Third Embodiment

The third embodiment offers the following advantages in addition to the advantages of the first embodiment and the second embodiment.

According to the third embodiment, after the threshold value TH_Sm has been set based on the intensity of the induced magnetic field prior to the application of external forces to the coupler 50, it is judged whether or not the intensity of the induced magnetic field at the time that external forces are applied to the coupler 50 is in excess of the threshold value TH_Sm, whereupon a judgment result is displayed by the judgment LED 150. Consequently, the user can detect without fail transient response variations in the induced magnetic field at the time that external forces are applied to the coupler 50.

According to the third embodiment, furthermore, the second flip-flop circuit 180, the second prescribed value generating circuit 182, and the preparation completion indicating LED 184 allow the threshold value TH_Sm to be adjusted automatically.

D. Fourth Embodiment

1. Configuration of Contact Fault Diagnosing System 210 and Harness 300

(1) Outline

Figure 17:
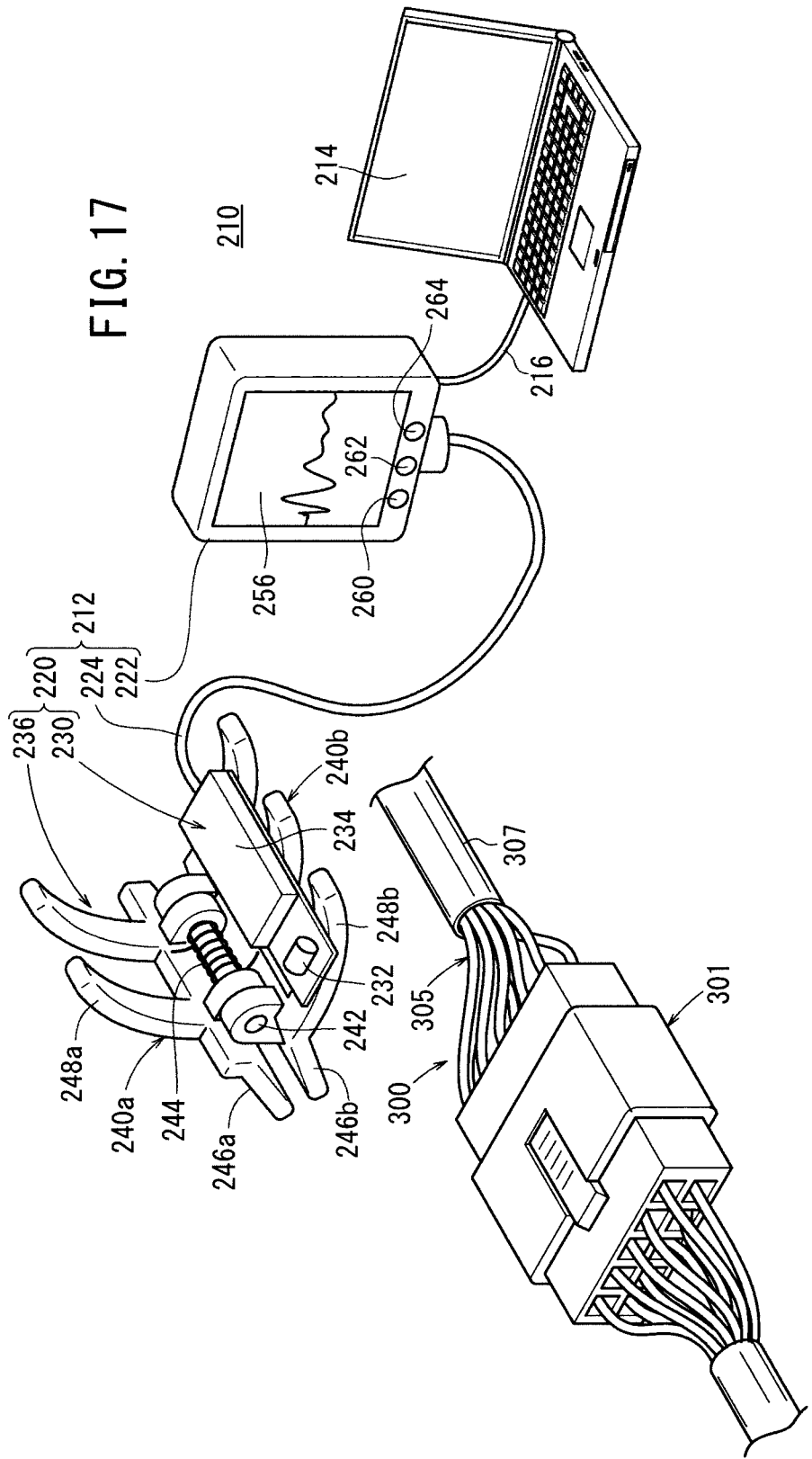
FIG. 17 is a perspective view of a contact fault diagnosing system including a diagnosing apparatus as a contact fault measuring apparatus according to a fourth embodiment of the present invention, and a harness to be measured by the contact fault diagnosing system.
Figure 18:
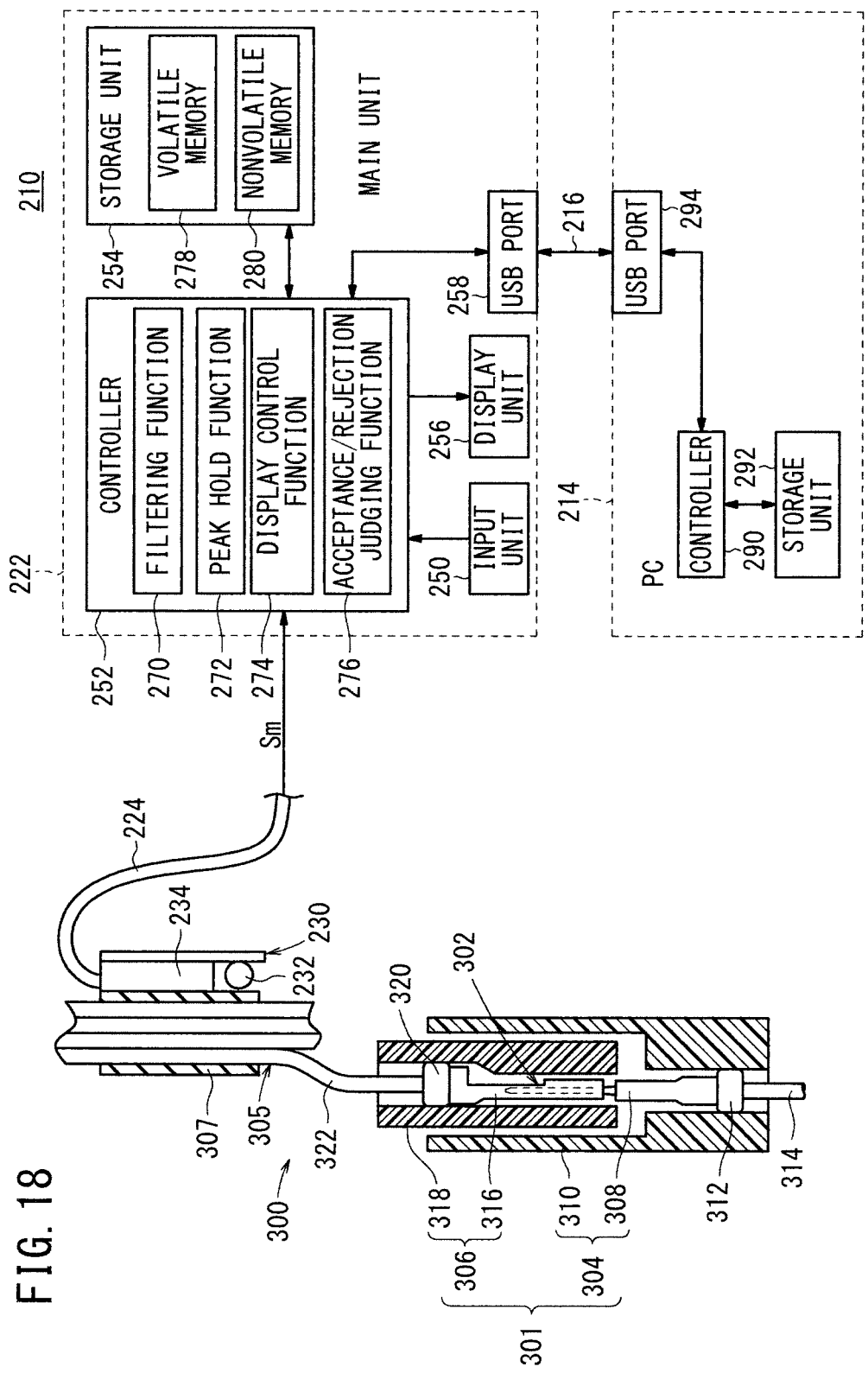
FIG. 18 is a block diagram of the contact fault diagnosing system according to the fourth embodiment, with internal structural details of the harness being shown in cross section.

FIG. 17 is a perspective view of a contact fault diagnosing system 210 (hereinafter also referred to as a "diagnosing system 210") including a diagnosing apparatus 212, which serves as a contact fault measuring apparatus according to a fourth embodiment of the present invention, and a harness 300 to be measured by the contact fault diagnosing system 210. FIG. 18 is a block diagram of the diagnosing system 210, with the internal structural details of the harness 300 being shown in cross section. Parts of the fourth embodiment, which are identical to those of the first through third embodiments, are denoted by identical reference characters, and such features will not be described in detail below.

The diagnosing apparatus 212 according to the fourth embodiment, which is designed for use in vehicles, detects a transient response variation in the vicinity of a harness 300 to be measured while the harness 300 is energized, and judges whether or not a contact fault exists between terminals in a terminal fitting portion 302 of a coupler unit 301 of the harness 300 based on the magnitude of the detected transient response variation. In the present embodiment as well as in the other embodiments, a contact failure between terminals may be caused by the occurrence of an oxide film, breakage or removal of pins of the terminals, deposition of oil or dust, etc.

As shown in FIG. 17, the harness 300 includes, in addition to the coupler unit 301, a wire bundle 305 and a sheath 307 that covers the wire bundle 305 (other components thereof will be described later with reference to FIG. 20).

(2) Diagnosing System 210

The diagnosing system 210 basically includes the diagnosing apparatus 212 and a personal computer 214 (hereinafter also referred to as a "PC 214") connected to the diagnosing apparatus 212 by a universal serial bus cable 216 (hereinafter also referred to as a "USB cable 216").

The diagnosing apparatus 212 includes a pickup device 220 for detecting the magnitude of a transient response variation in an induced magnetic field (more directly, the intensity of an induced magnetic field) around the harness 300, a main unit 222 for performing various control and calculating processes, and a cable 224 interconnecting the pickup device 220 and the main unit 222.

The pickup device 220 includes a magnetic sensor 230 having a detecting element 232 and a signal processor 234, and a clamp 236 that supports the magnetic sensor 230. According to the fourth embodiment, the detecting element 232 comprises an amorphous magnetic element for detecting a transient response variation in an induced magnetic field around the harness 300, and which generates a current depending on the magnitude of the detected transient response variation. The signal processor 234 processes, e.g., amplifies, an output signal from the detecting element 232, and outputs a signal representative of the magnitude of the transient response variation (magnetic-field-rate-of-change signal Sm) to the main unit 222.

The clamp 236 is shaped like a hair clip for bundling hairs. More specifically, the clamp 236 has two clamp members 240a, 240b, which are hinged to each other by a pin 242. The clamp 236 also includes a helical spring 244 disposed around the pin 242. The helical spring 244 has one end that engages the clamp member 240a and another end that engages the clamp member 240b. When the user grasps respective grips 246a, 246b (acting points) of the clamp members 240a, 240b, respective fingers 248a, 248b of the clamp members 240a, 240b are spread apart from each other about the pin 242 (see FIG. 17). When the user releases the grips 246a, 246b, the fingers 248a, 248b are displaced toward each other. In the fourth embodiment, the magnetic sensor 230 is fixed to an inner surface of the finger 248b that confronts the finger 248a.

Figure 19:
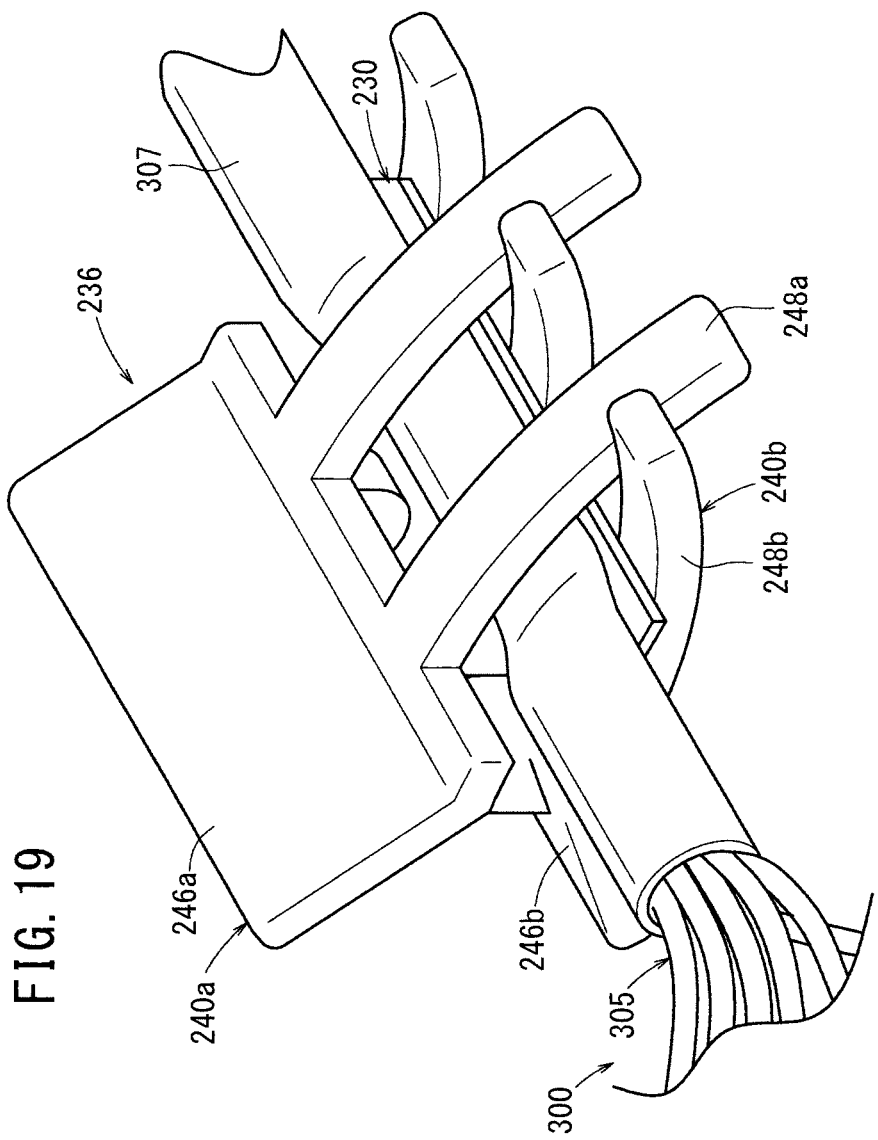
FIG. 19 is a view showing a pickup device with a closed clamp according to the fourth embodiment.

As shown in FIG. 19, according to the fourth embodiment, for detecting the magnitude of a transient response variation in an induced magnetic field around the harness 300, the harness 300 is gripped between the fingers 248a, 248b. Therefore, the magnetic sensor 230 is secured with respect to the harness 300.

As shown in FIG. 17, the detecting element 232 faces in a direction perpendicular to the axis of the harness 300. Therefore, the detecting element 232 is arranged in alignment with or parallel to the direction of a magnetic field that is generated when the harness 300 is energized (the direction of a line tangential to a circle concentric to the harness 300). As a result, the detecting element 232 has a maximum detecting sensitivity.

The clamp 236 having the above structure is capable of handling the harness 300 even if the thickness of the harness 300 changes.

As shown in FIG. 18, the main unit 222 includes an input section 250, a controller 252, a storage unit 254, a display unit 256, and a USB port 258. The input section 250 has a plurality of buttons 260, 262, 264 (FIG. 17) for the user to enter commands to the controller 252 pertaining to the judgment of a contact fault. In response to commands entered through the input section 250, the controller 252 controls the storage unit 254 and the display unit 256. According to the fourth embodiment, the controller 252 includes a filtering function 270, a peak hold function 272, a display control function 274, and an acceptance/rejection judging function 276. Such functions will be described later. The storage unit 254 has both a volatile memory 278 and a nonvolatile memory 280.

The PC 214, which includes a controller 290, a storage unit 292, and a USB port 294, can communicate with the main unit 222 through the USB cable 216. After the main unit 222 has acquired data, the PC 214 can perform a detailed analysis of the data, generate a report, and create a database.

(3) Harness 300 and Periphery Thereof

Figure 20:
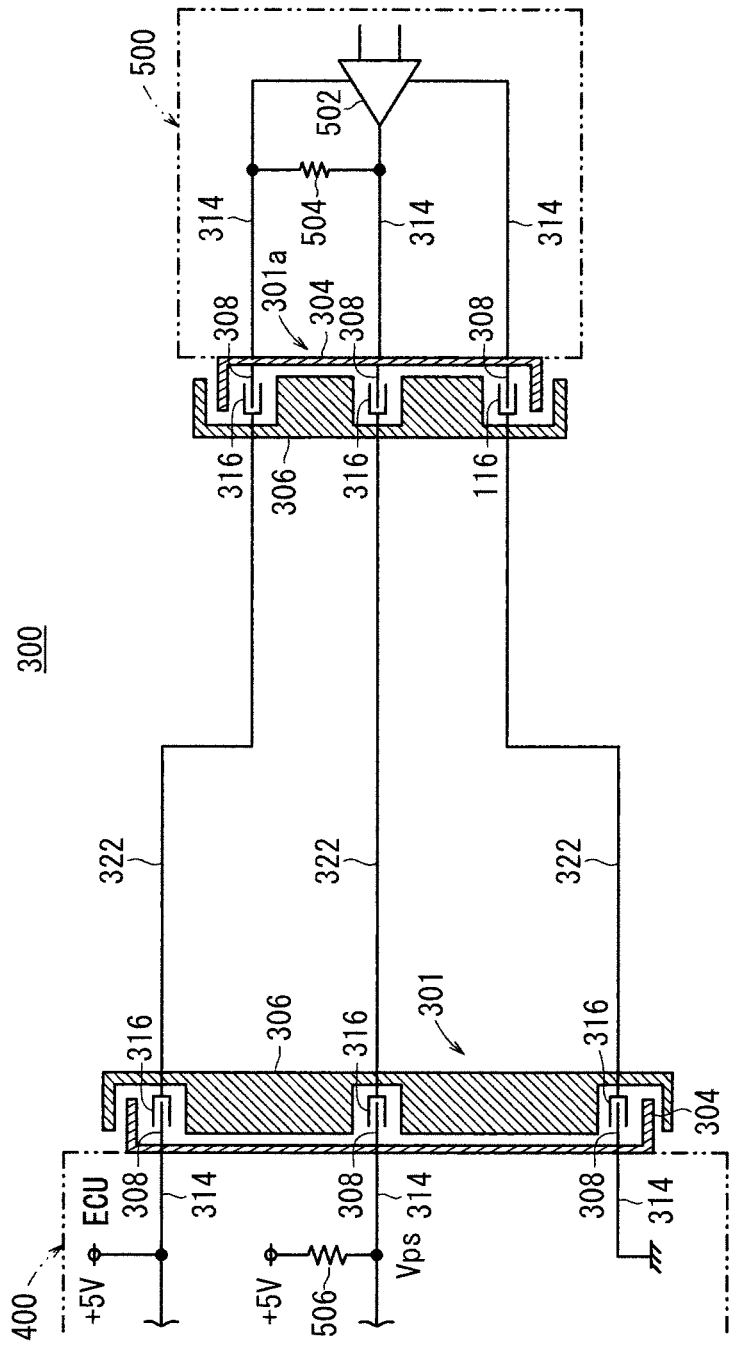
FIG. 20 is a perspective view of the harness and a portion to which the harness is connected according to the fourth embodiment.

FIG. 20 is a perspective view of the harness 300 and a portion to which the harness 300 is connected.

The harness 300 is disposed in an engine compartment and interconnects an electronic control unit 400 (hereinafter also referred to as an "ECU 400") of a vehicle 218 (FIG. 21) and a sensor (intake pressure sensor 500) of the vehicle 218. The coupler unit 301 is connected to one end of the harness 300, and another coupler unit 301a is connected to the other end of the harness 300. The coupler units 301, 301a are connected to each other by wires 322 of the wire bundle 305.

As shown in FIG. 18, each of the coupler units 301, 301a comprises a water-resistant coupler unit having a male-terminal coupler 304 and a female-terminal coupler 306.

The male-terminal coupler 304 has a resin-made housing 310 accommodating a male terminal 308 therein, which is secured together with a water-resistant rubber spacer 312 interposed therebetween, and a wire 314 connecting the male terminal 308 to the ECU 400 or the intake pressure sensor 500. Similarly, the female-terminal coupler 306 includes a female terminal 316, a housing 318 accommodating the female terminal 316 therein, which is secured together with a water-resistant rubber spacer 320 interposed therebetween, and a wire 322 interconnecting the female terminal 316 of the coupler unit 301 and a female terminal 316 of the other coupler unit 301a. In FIG. 20, the housings 310, 318 and the water-resistant rubber spacers 312, 320 are omitted from illustration.

The intake pressure sensor 500 measures the intake pressure Ps [kPa], which is indicative of the pressure of an intake air-fuel mixture in the intake manifold. The intake pressure sensor 500 includes a comparator 502 and a resistor 504, which cooperates with a resistor 506 that is connected to a power supply voltage of +5 [V] in making up a voltage divider. The voltage divider generates a voltage Vps [V], which corresponds to the intake pressure Ps, and which is detected by the ECU 400.

2. Measurement of Contact Fault

The user operation sequence for measuring a contact fault between terminals in the terminal fitting portion 302 according to the fourth embodiment is the same as with the first embodiment (FIG. 3). In the fourth embodiment as well, it is judged whether the fault depending on the fault code is reproduced or not (S5 in FIG. 3), and if the fault is not reproduced (S5: NO), the user confirms whether or not a temporary contact fault has occurred.

Figure 21:
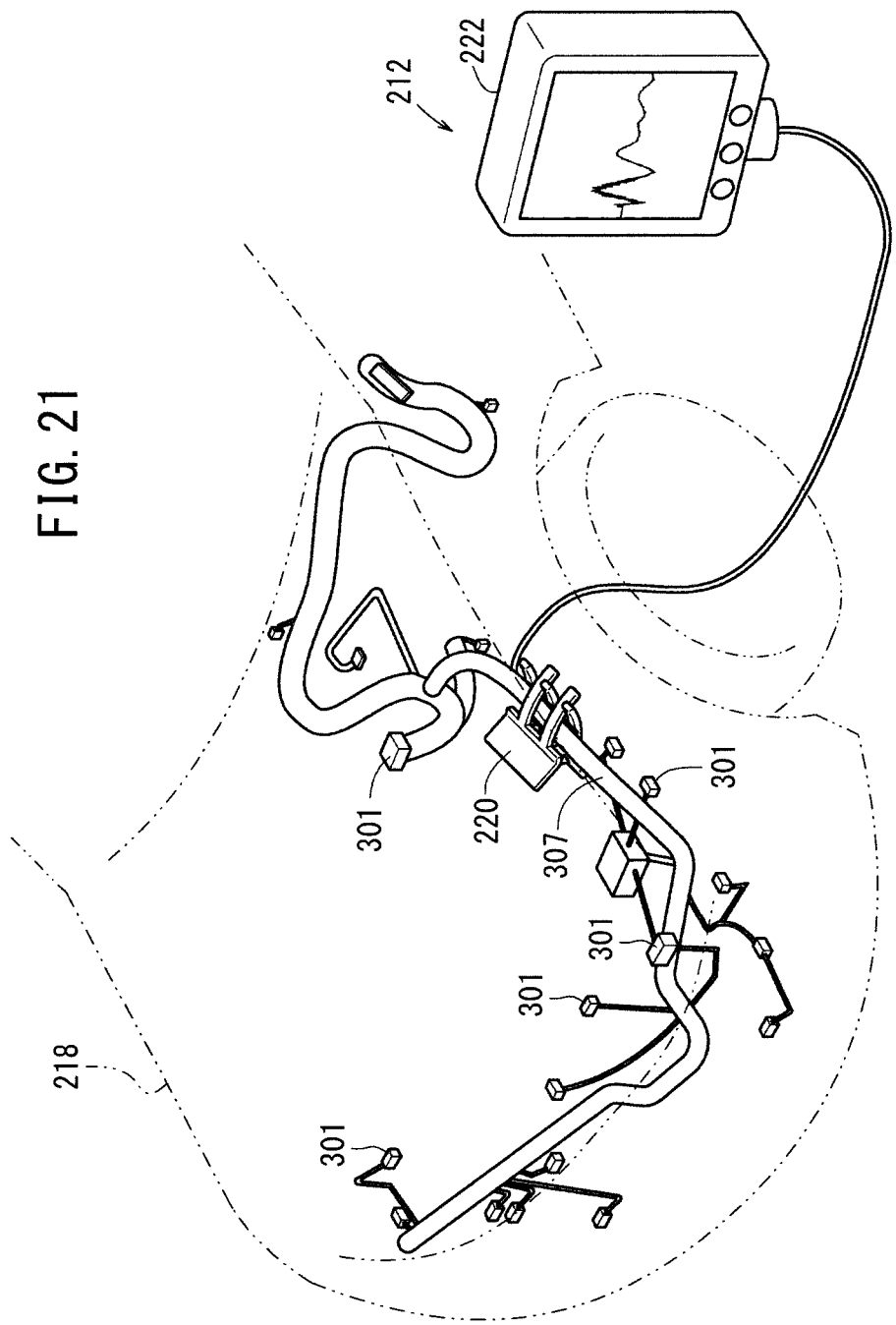
FIG. 21 is a view showing the contact fault measuring apparatus according to the fourth embodiment, which is installed in a vehicle for confirming the occurrence of a temporary contact fault.

FIG. 21 is a view showing the diagnosing apparatus 212, which is installed in the vehicle 218 for confirming the occurrence of a temporary contact fault. According to the fourth embodiment, for confirming the occurrence of a temporary contact fault, the wire bundle 305 of the harness 300 to be measured is gripped by the clamp 236, thereby securing the magnetic sensor 230 to the wire bundle 305 (see FIG. 21). The clamp 236 may be attached to any portion of the harness 300 where the clamp 236 can easily be attached. The user then turns on the IGSW 22 in order to energize the harness 300 (target harness) to which the coupler unit 301 to be measured is connected. Then, the user operates the diagnosing apparatus 212 while oscillating or hitting the coupler unit 301 and the wire bundle 305 directly or indirectly by applying external forces to the terminal fitting portion 302. For example, the user may perform a wiggle test successively on the coupler units 301 (FIG. 21) (see, for example, FIG. 8).

For example, while the user is conducting the wiggle test successively on the coupler units 301 in a wiring system identified as an abnormal system, the magnetic sensor 230 detects the magnitude of a transient response variation around the wire bundle 305, thereby judging whether or not there is a contact fault in the terminal fitting portion 302 of each coupler unit 301.

Figure 22:
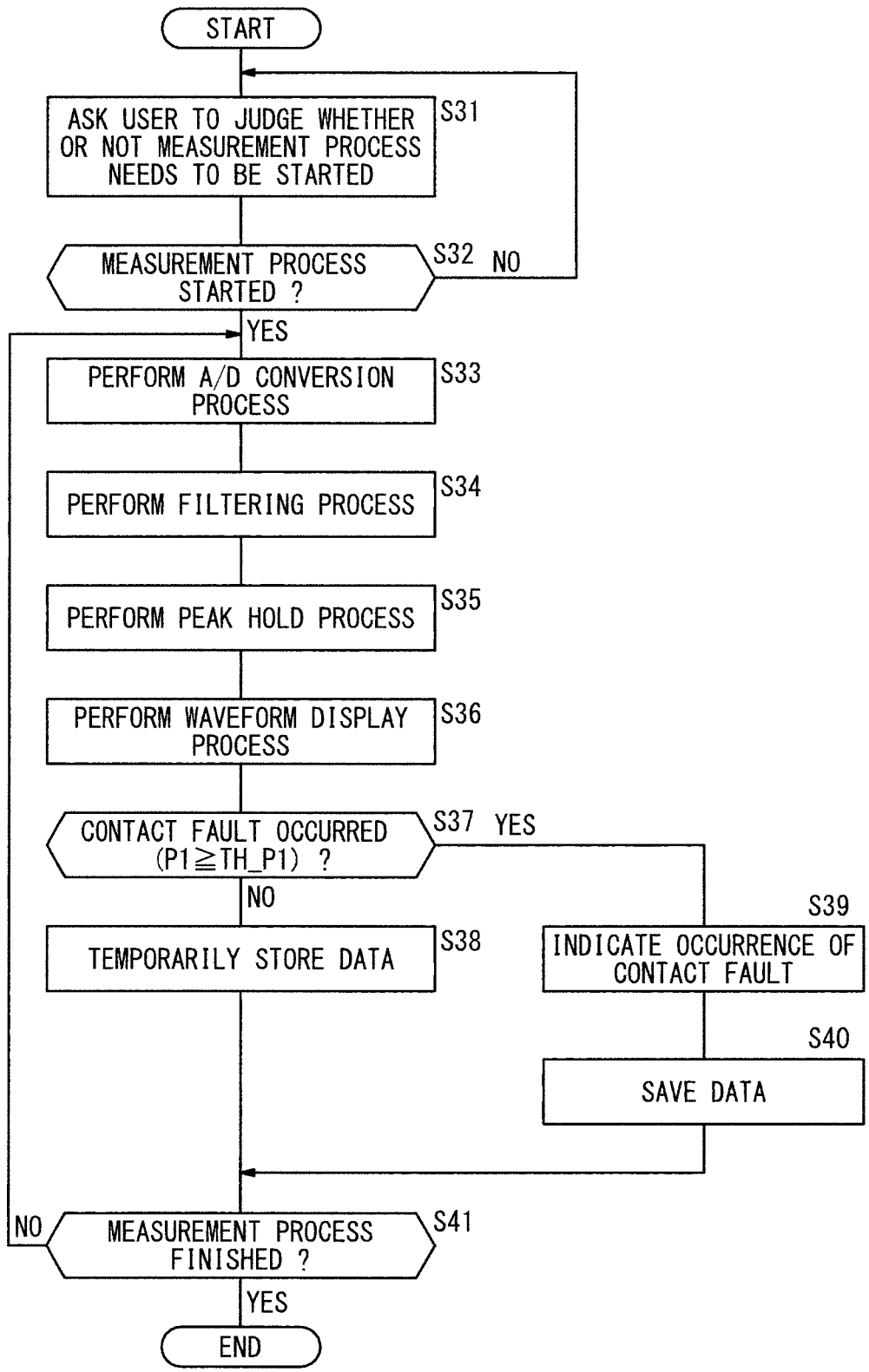
FIG. 22 is a flowchart of an operation sequence of the diagnosing apparatus according to the fourth embodiment, by which a user can judge whether or not a contact fault occurs in a terminal fitting portion using the diagnosing apparatus.

FIG. 22 is a flowchart of an operation sequence of the diagnosing apparatus 212 by which the user can judge whether or not a contact fault occurs in the terminal fitting portion 302 using the diagnosing apparatus 212.

With a power supply (not shown) of the main unit 222 turned on, in step S31, the controller 252 of the diagnosing apparatus 212 asks the user to judge whether or not a measurement process should be started. More specifically, if preparations (including the positioning of the pickup device 220) for the measurement process have been completed, then the controller 252 displays a message on the display unit 256 requesting the user to press a certain one of the buttons of the input section 250.

When the pickup device 220 is positioned, the detecting element 232 of the pickup device 220 is not necessarily required to be positioned in alignment with the terminal fitting portion 302, but may be positioned in alignment with the wires 322 or the wire bundle 305, which are identified as an abnormal system to be measured.

After the harness 300 has been identified, the user selects a position where the harness 300 can easily be gripped, and grips the selected position with the clamp 236. The magnetic sensor 230 disposed inside the fingers 248a, 248b of the clamp 236 is thereby secured to the harness 300.

In step S32, the controller 252 confirms whether or not the measurement process needs to be started (i.e., whether the certain button has been pressed). If the measurement process is not to be started (S32: NO), then control returns to step S31. If the measurement process is to be started (S32: YES), then control proceeds to step S33. In a subsequent sequence, the user applies external forces to the coupler unit 301, the wire bundle 305, and the clamp 236 at a desired timing, thereby applying external forces to the terminal fitting portion 302. In this manner, a contact fault, which has occurred again due to the applied external forces, can be detected in a region where the terminal fitting portion 302 was originally in a normal contact state but is in an unstable contact state.

In step S33, the controller 252 supplies electric power to the magnetic sensor 230 from a power supply (not shown). The controller 252 then receives a magnetic-field-rate-ofchange signal Sm, which is representative of the magnitude (detected value) of a transient response variation detected by the magnetic sensor 230, and performs an analog-to-digital (A/D) conversion process on the data of the detected value from the magnetic sensor 230.

In step S34, using the filtering function 270, the controller 252 performs a filtering process on the A/D-converted magnetic-field-rate-of-change signal Sm. The filtering process is a bandpass process with a frequency pass band, which can be produced upon the occurrence of a contact fault in the terminal fitting portion 302. Alternatively, the filtering process may be a high-pass process or a low-pass process.

In step S35, using the peak hold function 272, the controller 252 performs a peak hold process on the filtered magnetic-field-rate-of-change signal Sm. The peak hold process is a process for holding the peak value of the amplitude of the magnetic-field-rate-of-change signal Sm.

In step S36, using the display control function 274, the controller 252 performs a waveform displaying process for displaying the waveform of the amplitude of the magnetic-field-rate-of-change signal Sm on the display unit 256. The waveform displaying process updates, as needed, the waveform of an amplitude in one control period (e.g., from several microseconds to several milliseconds). Therefore, by repeating step S36, the waveform displaying process displays a waveform of successive amplitudes. The displayed amplitude of the magnetic-field-rate-of-change signal Sm may be selected as one from among any of the amplitude after the magnetic-field-rate-of-change signal Sm is A/D-converted (S33), the amplitude after the magnetic-field-rate-of-change signal Sm is filtered (S34), and the amplitude after the peak of the magnetic-field-rate-of-change signal Sm is held (S35). One of the above amplitudes is selected by the user using the input section 250.

In step S37, the controller 252 judges whether or not a contact fault has occurred using the acceptance/rejection judging function 276. If a contact fault has not occurred, the coupler unit to be measured is accepted. If a contact fault has occurred, the coupler unit to be measured is rejected.

More specifically, the controller 252 judges whether or not the peak value P1 obtained by the peak hold process is equal to or greater than a threshold value TH_P1. The threshold value TH_P1 is a threshold value that is used to judge the occurrence of a contact fault in the terminal fitting portion 302. If a contact fault has not occurred (i.e., if the conductive state does not change to a non-conductive state), then since the intensity of the induced magnetic field around the harness 300 remains unchanged, the peak value P1 does not exceed the threshold value TH_P1. On the other hand, if a contact fault has occurred (i.e., if the conductive state changes to an non-conductive state, or subsequently, the non-conductive state changes to a conductive state), then since the transient response variation in the induced magnetic field around the harness 300 becomes temporarily greater, the peak value P1 exceeds the threshold value TH_P1. Accordingly, it is possible to determine whether or not a contact fault has occurred.

If a contact fault has not occurred (S37: NO), then in step S38, the controller 252 temporarily stores the data of the amplitude of the magnetic-field-rate-of-change signal Sm in the volatile memory 278 using the acceptance/rejection judging function 276. The amplitude of the magnetic-field-rate-of-change signal Sm may be selected as one from among any of the amplitude after the magnetic-field-rate-of-change signal Sm is A/D-converted (S33), the amplitude after the magnetic-field-rate-of-change signal Sm is filtered (S34), and the amplitude after the peak value of the magnetic-field-rate-of-change signal Sm has been held (S35). One of the above amplitudes is selected by the user using the input section 250. The volatile memory 278 is a first-in first-out memory (serial-in serial-out memory) for storing the value of the amplitude for a certain period of time (e.g., from several seconds to several tens of minutes).

Figure 23:
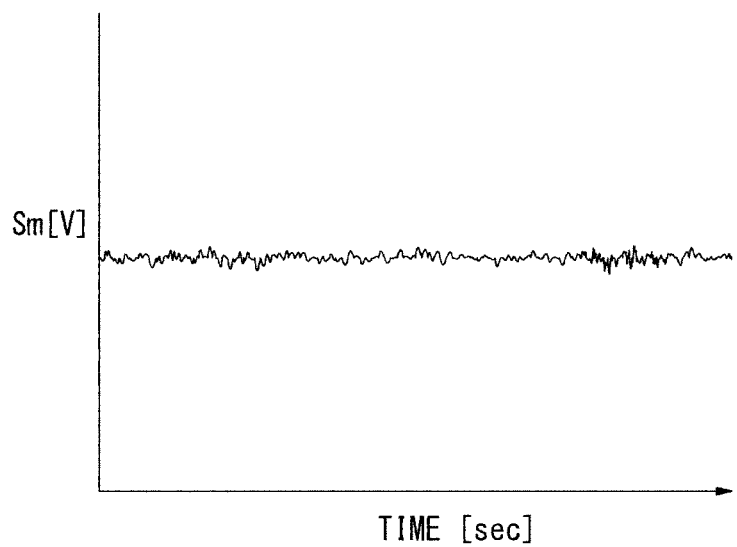
FIG. 23 is a diagram showing by way of example the waveform of a magnetic-field-rate-of-change signal generated when a contact fault does not occur according to the fourth embodiment.

If a contact fault has not occurred continuously, then the magnetic-field-rate-of-change signal Sm is of the waveform shown in FIG. 23. The waveform of the magnetic-field-rate-of-change signal Sm shown in FIG. 23 is produced after the magnetic-field-rate-of-change signal Sm is A/D-converted (S33).

If a contact fault has occurred (S37: YES), then in step S39, the controller 252 indicates the occurrence of the contact fault on the display unit 256 using the acceptance/rejection judging function 276. For example, the controller 252 may control the display unit 256 to display a message representing the occurrence of the contact fault, or may control the display unit 256 to output a warning sound or a voice output representing the occurrence of the contact fault. Alternatively, the display unit 256 may blink the image of the waveform of the amplitude of the magnetic-field-rate-of-change signal Sm, which is displayed by the waveform displaying process (S36).

Figure 24:
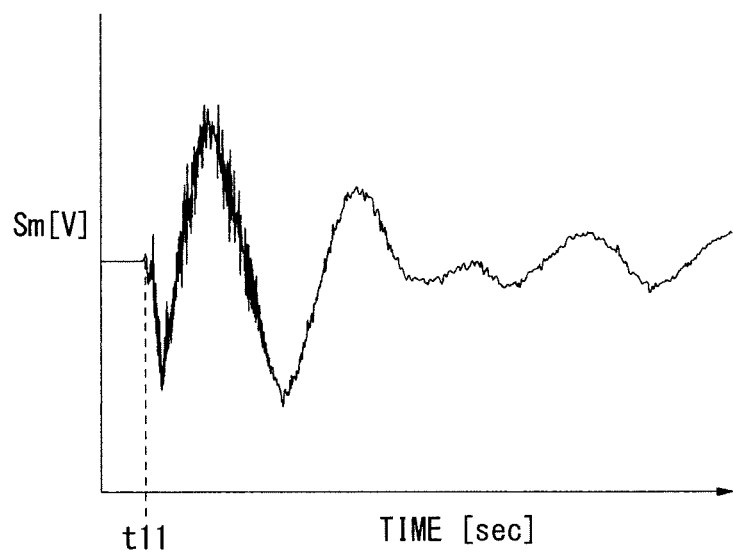
FIG. 24 is a diagram showing by way of example the waveform of a magnetic-field-rate-of-change signal generated when a contact fault occurs according to the fourth embodiment.

In step S40, the controller 252 acquires the data of the amplitude of the magnetic-field-rate-of-change signal Sm over a given period (e.g., several seconds) using the acceptance/rejection judging function 276, continues to store the acquired data in the volatile memory 278, and saves the data from the volatile memory 278 in the nonvolatile memory 280 (automatic trigger function). As a result, the waveform shown in FIG. 24 is acquired. In FIG. 24, since the contact fault occurs again at time t11 in the terminal fitting portion 302, the intensity of the induced magnetic field temporarily varies significantly, followed subsequently for a given period by a large transient response variation. Instead of performing the automatic trigger function, the user may perform an operation to save the data without deleting the data (manual trigger function).

If the main unit 222 includes a clock function, then time information may also be saved. The stored data may be transferred to the PC 214 over the USB cable 216, whereupon the PC 214 processes the transferred data.

After step S38 or step S40, the controller 252 judges whether or not the measurement process should be brought to an end, by determining whether or not a certain button in the input section 250 has been pressed. If the measurement process is to be completed (S41: YES), then the controller 252 saves all of the data collected so far in the nonvolatile memory 280 of the storage unit 254, after which the measurement process is brought to an end. If the measurement process is not to be ended (S41: NO), then control returns to step S33, whereupon the operation sequence is started again for a subsequent control cycle. The process according to steps S33 through S38 and S41 is performed during a period ranging from several microseconds to several milliseconds.

3. Advantages of the Fourth Embodiment

The fourth embodiment offers the following advantages, in addition to the advantages of the first through third embodiments.

According to the fourth embodiment, the result of a judgment is indicated as to whether or not the peak value P1 exceeds the threshold value TH_P1 at the time that external forces are applied. More specifically, if the peak value P1 does not exceed the threshold value TH_P1, the display unit 256 continues to update the waveform of the magnetic-field-rate-of-change signal Sm, thereby indicating to the user that the peak value P1 does not exceed the threshold value TH_P1. If the peak value P1 exceeds the threshold value TH_P1, then the display unit 256 displays a message, indicating to the user that the peak value P1 has exceeded the threshold value TH_P1. Accordingly, without the need for separating the terminal fitting portion 302 (i.e., while the terminal fitting portion 302 remains connected), upon the occurrence of an abnormality, it is possible to judge whether or not there is a contact fault in the terminal fitting portion 302 based on the judgment result.

The threshold value TH_P1 for the intensity of the induced magnetic field, which is used to judge a contact fault, is represented by the value of a variation in the induced magnetic field, which is too large to be generated if current continues to flow in the terminal fitting portion 302 before and after external forces are applied thereto. Therefore, even if there is something that generates a steady noise or a magnetic field around the terminal fitting portion 302, it is possible to judge whether or not there is a contact fault essentially without being adversely affected by the noise or the magnetic field. Therefore, the measurement process can be carried out even in a space such as the engine compartment of the vehicle 10, which is crammed full of wires and other components.

Since the coupler unit 301 is water-resistant, the coupler unit 301 does not need to be disassembled, and the water resistance of the coupler unit 301 is not impaired in hermetically sealed applications.

According to the fourth embodiment, the magnetic sensor 230 continuously detects a transient response variation in the induced magnetic field around the harness 300, which is being energized, during which time the diagnosing apparatus 212 continuously judges whether or not the peak value P1 exceeds the threshold value TH_P1 at the time that external forces are applied. If the peak value P1 exceeds the threshold value TH_P1, the diagnosing apparatus 212 controls the display unit 256 to display an indication that the peak value P1 has exceeded the threshold value TH_P1, thereby allowing the user to easily confirm the occurrence of a contact fault.

According to the fourth embodiment, the transient response variation in the induced magnetic field, which is continuously detected by the magnetic sensor 230, is temporarily stored in the volatile memory 278. When the controller 252 determines that the peak value P1 at the time external forces are applied exceeds the threshold value TH_P1, the controller 252 stores the data, which are indicative of the transient response variations in the induced magnetic field before and after the peak value P1 exceeds the threshold value TH_P1, in the nonvolatile memory 280. Therefore, it is possible to effectively store the data of the transient response variations in the induced magnetic field before and after the contact fault occurs, without requiring the nonvolatile memory 280 to have an excessively large storage capacity.

The magnetic sensor 230 is of a magnetic impedance effect type having an amorphous magnetic element as the detecting element 232. Also, the magnetic sensor 230 is fixed to the clamp 236 that grips the harness 300. The pickup device 220 detects a transient response variation in the induced magnetic field while the clamp 236 grips the harness 300, and with the detecting element 232 being arranged perpendicularly to the harness 300 to be measured. It is thus possible for the pickup device 220 to detect a transient response variation in the induced magnetic field while the detecting element 232 and the harness 300 are secured in a relative positional relationship by the clamp 236 and with the detecting element 232 being of maximum sensitivity. Accordingly, the pickup device 220 can stably detect a transient response variation in the induced magnetic field, even when external forces are applied to the terminal fitting portion 302.

The controller 252 of the diagnosing apparatus 212 includes the filtering function 270 for passing only a component in a frequency band of the magnetic-field-rate-of-change signal Sm that can be generated upon the occurrence of a contact fault. Therefore, only a component in a frequency band of the magnetic-field-rate-of-change signal Sm, which can be generated by the occurrence of a contact fault in the terminal fitting portion 302, is extracted, and data are stored in the storage unit 254 and displayed on the display unit 256 based on the peak value P1 of the component. Consequently, it is possible to avoid an erroneous decision due to causes other than a contact fault, and also to reliably display the occurrence of a contact fault in the terminal fitting portion 302, and to store data concerning the contact fault.

E. Modifications

The present invention is not limited to the above-described embodiments, but may adopt various arrangements based on the disclosure of the present description. For example, the following alternative arrangements may be adopted.

In the first through third embodiments, the contact fault measuring apparatus 14, 14A, 14B are constructed and intended for use in vehicles. However, the contact fault measuring apparatus 14, 14A, 14B are not limited to such an application, but may be used in other applications as well. Similarly, although the diagnosing apparatus 212 according to the fourth embodiment is constructed for use in vehicles, the diagnosing apparatus 212 may be used in other applications that employ the coupler units 301, 301a.

In the first through third embodiments, the magnetic field detector 60 includes the single-turn detecting coil 70, and in the fourth embodiment, the pickup device 220 includes the magnetic sensor 230. However, the detecting element for detecting a transient response variation is not limited to such devices. The single-turn detecting coil 70 may be replaced with a detecting coil having more wire turns therein. In the first through third embodiments, the magnetic field detector 60 includes the ring-shaped ferrite core 74. However, the magnetic field detector 60 may include a ferrite bar. According to such a modification, the detecting coil is wound on the ferrite bar, and the ferrite bar is placed such that the axis thereof lies perpendicularly to the harness 80. Alternatively, the ferrite core 74 may be dispensed with, and a detecting coil made up of a plurality of wire turns may be disposed as an air core coil adjacent to the harness 80. The size of the ferrite core 74 may be adjusted to increase the detecting sensitivity of the detecting coil 70.

In the first through third embodiments, the IGSW 22 is turned on to energize the harness 80 (target harness) to which the coupler 50 to be measured is connected. However, it is possible to detect a contact fault in the coupler 50 to be measured without energizing the target harness, but by energizing an adjacent harness 80 in order to keep the target harness electrically charged. Similarly, a contact fault in the coupler 50 to be measured may be detected while the target harness is electrically charged by means of a dark current (a certain constant level of noise) or while the target harness is electrically charged by a device disposed outside of the target harness to electrically charge the target harness, or while the target harness is electrically charged naturally by ions in the air. Such a situation also applies to the fourth embodiment.

External forces are applied to the coupler 50 by the user's finger in the first embodiment and by the vibrating tool 120 in the second and third embodiments. External forces are applied to the coupler units 301, 301*a* by the user's finger in the fourth embodiment. However, a vibration applying mechanism for automatically vibrating the harness 80 may also be employed. The occurrence of a contact fault may be confirmed by continuously monitoring the timing at which the external forces are applied and the detected value D1 from the magnetic field detector 60, while the coupler 50 is directly or indirectly vibrated by means of the vibration applying mechanism. Such a modification is particularly useful in an application for inspecting finished products on a production line for automobiles or the like.

In the first through third embodiments, the application of external forces to the coupler 50 is detected by the acceleration sensor 90. However, the application of external forces to the coupler 50 may be detected by another device. For example, instead of the acceleration sensor 90, the application of external forces to the coupler 50 may be detected by a pressure sensor.

In the third embodiment, the threshold value TH_Sm concerning the intensity (peak value) of the induced magnetic field is used to judge a contact fault. However, a threshold value concerning amplitude, a bottom value, an average value, or an envelope of the magnetic-field-rate-of-change signal Sm may be used. In the third embodiment, the detected value is compared with the threshold value TH_Sm in order to judge whether or not a contact fault has occurred. However, it is possible to determine that a contact fault has occurred if a moving average of the detected value D1 has changed at a certain rate per unit time (i.e., if the rate of change or gradient of the magnetic-field-rate-of-change signal S exceeds a certain value). Such a situation also applies to the fourth embodiment.

In the third embodiment, an output from the judgment LED 150 takes place in the event of a temporary contact fault. In the fourth embodiment, an output on the display unit 256 takes place in the event of a temporary contact fault. However, the occurrence of a contact fault may be indicated by other processes. For example, if the measuring apparatus 14B or the diagnosing apparatus 212 is incorporated in an automated system, an electric signal representative of the occurrence of a contact fault may be output to a controller of the automated system, whereby the controller shuts down the automated system in response to the electric signal.

In addition to the above modifications, the configurations or processes according to the first through fourth embodiments may be applied to each other.

The invention claimed is:

1. A contact fault measuring method of measuring whether or not there is a contact fault in a terminal fitting portion of a harness in a wiring system, comprising:
   placing a magnetic sensor in proximity to the harness to be measured; and
   applying external forces to the terminal fitting portion of the harness to be measured, detecting, with the magnetic sensor, the magnitude of a transient response variation in an induced magnetic field around the harness at a timing at which the external forces are applied, and displaying the detected magnitude as an indicator of whether or not a contact state of the terminal fitting portion is acceptable.

2. The contact fault measuring method according to claim 1, further comprising:
   judging whether or not the magnitude of the transient response variation in the induced magnetic field around the harness when the external forces are applied exceeds a threshold value for determining the occurrence of a contact fault, and displaying the judgment result as the indicator of whether or not the contact state is acceptable.

3. The contact fault measuring method according to claim 2, wherein the magnetic sensor continuously detects the magnitude of the transient response variation in the induced magnetic field around the harness, and judges whether or not the detected magnitude exceeds the threshold value; and
   when the detected magnitude exceeds the threshold value, the judgment result is displayed on a display unit as the indicator of whether or not the contact state is acceptable.

4. The contact fault measuring method according to claim 3, further comprising:
   storing the magnitude of the transient response variation in the induced magnetic field, which is continuously detected by the magnetic sensor, in a temporary storage unit; and
   when the magnitude of the transient response variation in the induced magnetic field is judged to exceed the threshold value, saving the magnitudes of transient response variations in the induced magnetic field, which are stored in the temporary storage unit before and after the magnitude of the transient response variation in the induced magnetic field is judged, in a saving unit.

5. The contact fault measuring method according to claim 1, wherein the magnetic sensor secures the harness in a gripped state.

6. The contact fault measuring method according to claim 1, further comprising:
   detecting the timing of the external forces applied to the terminal fitting portion of the harness to be measured, with an external force detecting sensor; and
   displaying the state of occurrence of a contact fault on a display unit, using the magnitude of the transient response variation in the induced magnetic field around the harness when the external forces are applied.

7. The contact fault measuring method according to claim 6, wherein the magnetic sensor continuously detects the magnitude of the transient response variation in the induced magnetic field around the harness, further comprising:
   judging, with a judgment section, whether or not the magnitude of the transient response variation when the external forces are applied to the terminal fitting portion exceeds a threshold value for determining the occurrence of a contact fault; and
   displaying on the display unit the judgment result as the indicator of whether or not the contact state is acceptable.

8. The contact fault measuring method according to claim 6, wherein a vibrating tool for applying the external forces to the terminal fitting portion of the harness is provided, and the external force detecting sensor is mounted on the vibrating tool.

9. The contact fault measuring method according to claim 6, wherein the external force detecting sensor comprises an acceleration sensor.

10. A contact fault measuring apparatus for measuring whether or not there is a contact fault in a terminal fitting portion of a harness in a wiring system, comprising:
    a magnetic sensor detachably fixed in a position proximal to the harness to be measured;
    a display unit for displaying the magnitude of a transient response variation in an induced magnetic field around the harness, which is represented by an output signal from the magnetic sensor at a timing at which external forces are applied to the terminal fitting portion of the harness to be measured, as an indicator of whether or not a contact state of the terminal fitting portion of the harness to be measured is acceptable.

11. The contact fault measuring apparatus according to claim 10, further comprising:
a judgment section for judging whether or not the magnitude of the transient response variation in the induced magnetic field around the harness, which is represented by an output signal from the magnetic sensor, exceeds a threshold value for determining the occurrence of a contact fault in the terminal fitting portion;
wherein, when the magnitude of the transient response variation in the induced magnetic field exceeds the threshold value, the display unit displays an indication that the magnitude of the transient response variation in the induced magnetic field has exceeded the threshold value.

12. The contact fault measuring apparatus according to claim 10, further comprising:
a frequency filter for removing components of the output signal from the magnetic sensor, other than a component in a frequency band that can be generated upon the occurrence of the contact fault; and
a peak hold circuit for holding a peak value of a value represented by an output signal from the frequency filter;
wherein, when the peak value exceeds the threshold value, the display unit displays an indication that the peak value has exceeded the threshold value.

13. The contact fault measuring apparatus according to claim 12, further comprising:
a temporary storage unit for continuously and temporarily storing the output signal from the magnetic sensor; and
a saving unit for saving the output signal from the magnetic sensor;
wherein the magnitude of the transient response variation in the induced magnetic field, which is continuously detected by the magnetic sensor, is stored in the temporary storage unit; and
when the peak value exceeds the threshold value, the magnitudes of transient response variations in the induced magnetic field, which are stored in the temporary storage unit before and after the peak value exceeds the threshold value, are saved in the saving unit.

14. A contact fault measuring apparatus for measuring whether or not there is a contact fault in a terminal fitting portion of a harness in a wiring system, comprising:
a magnetic sensor for detecting the magnitude of a transient response variation in an induced magnetic field around the harness to be measured;
an external force detecting sensor for detecting the timing of external forces applied to the terminal fitting portion of the harness to be measured; and
a display unit for displaying the timing of the applied external forces, which is detected by the external force detecting sensor, and the magnitude, which is represented by an output signal from the magnetic sensor, of the transient response variation in the induced magnetic field around the harness.

15. A contact fault measuring apparatus for measuring whether or not there is a contact fault in a terminal fitting portion of a harness in a wiring system, comprising:
a magnetic sensor for detecting the magnitude of a transient response variation in an induced magnetic field around the harness to be measured;
an external force detecting sensor for detecting the timing of external forces applied to the terminal fitting portion of the harness to be measured;
a judgment section for judging whether or not the magnitude of the transient response variation in the induced magnetic field around the harness, which is represented by an output signal from the magnetic sensor, exceeds a threshold value for determining the occurrence of a contact fault in the terminal fitting portion; and
a display unit for displaying a judgment result from the judgment section based on the timing of applied external forces detected by the external force detecting sensor.

16. The contact fault measuring apparatus according to claim 14, further comprising:
a vibrating tool for applying the external forces to the terminal fitting portion of the harness, the external force detecting sensor being mounted on the vibrating tool.

17. The contact fault measuring apparatus according to claim 14, wherein the external force detecting sensor comprises an acceleration sensor.

18. A contact fault measuring method of measuring whether or not there is a contact fault in a terminal fitting portion of a harness in a wiring system, comprising:
detecting, with a magnetic sensor, the intensity of an induced magnetic field around the harness to be measured;
detecting, with an external force detecting sensor, external forces applied to the terminal fitting portion of the harness to be measured;
simultaneously displaying, on a display unit, an output waveform from the magnetic sensor and an output waveform from the external force detecting sensor; and
measuring the state of occurrence of a contact fault based on the magnitude of a variation in the output waveform from the magnetic sensor immediately after the external forces are applied, with respect to the output waveform from the magnetic sensor before the external forces are applied, or based on a gradient of the output waveform from the magnetic sensor immediately after the external forces are applied.

19. A contact fault measuring method of measuring whether or not there is a contact fault in a terminal fitting portion of a harness in a wiring system, comprising:
detecting, with a magnetic sensor, the intensity of an induced magnetic field around the harness to be measured, and outputting the detected intensity of the induced magnetic field to a judgment section;
detecting, with an external force detecting sensor, external forces applied to the terminal fitting portion of the harness to be measured, and outputting the detected external forces to the judgment section; and
measuring, with the judgment section, the state of occurrence of a contact fault based on a change in the intensity of the induced magnetic field immediately after the external forces are applied, with respect to the intensity of the induced magnetic field before the external forces are applied, or based on a rate of change in the intensity of the induced magnetic field immediately after the external forces are applied.

20. The contact fault measuring apparatus according to claim 15, further comprising:
a vibrating tool for applying the external forces to the terminal fitting portion of the harness, the external force detecting sensor being mounted on the vibrating tool.

21. The contact fault measuring apparatus according to claim 15, wherein the external force detecting sensor comprises an acceleration sensor.

* * * * *